US011551999B2

(12) United States Patent
Chuang et al.

(10) Patent No.: US 11,551,999 B2
(45) Date of Patent: Jan. 10, 2023

(54) MEMORY DEVICE AND MANUFACTURING METHOD THEREOF

(71) Applicant: Taiwan Semiconductor Manufacturing Co., Ltd., Hsinchu (TW)

(72) Inventors: Lipu Kris Chuang, Hsinchu (TW); Chung-Shi Liu, Hsinchu (TW); Han-Ping Pu, Taichung (TW); Hsin-Yu Pan, Taipei (TW); Ming-Kai Liu, Hsinchu (TW); Ting-Chu Ko, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/897,300

(22) Filed: Jun. 10, 2020

(65) Prior Publication Data

US 2021/0202354 A1 Jul. 1, 2021

Related U.S. Application Data

(60) Provisional application No. 62/953,502, filed on Dec. 25, 2019.

(51) Int. Cl.
*H01L 25/065* (2006.01)
*H01L 23/00* (2006.01)
(Continued)

(52) U.S. Cl.
CPC ........ *H01L 23/481* (2013.01); *H01L 21/4875* (2013.01); *H01L 21/56* (2013.01);
(Continued)

(58) Field of Classification Search
CPC . H01L 23/481; H01L 23/3107; H01L 23/367; H01L 2224/02372; H01L 2225/06503–06596; H01L 25/117; H01L 25/0756; H01L 25/074; H01L 25/0657; H01L 25/043; H01L 23/34–4735
See application file for complete search history.

(56) References Cited

U.S. PATENT DOCUMENTS 8,993,380 B2 3/2015 Hou et al.
9,281,254 B2 3/2016 Yu et al.
(Continued)

*Primary Examiner* — Mary A Wilczewski
*Assistant Examiner* — Tsz K Chiu
(74) *Attorney, Agent, or Firm* — JCIPRNET

(57) ABSTRACT

A memory device including a base chip and a memory cube mounted on and connected with the base chip is described. The memory cube includes multiple stacked tiers, and each tier of the multiple stacked tiers includes semiconductor chips laterally wrapped by an encapsulant and a redistribution structure. The semiconductor chips of the multiple stacked tiers are electrically connected with the base chip through the redistribution structures in the multiple stacked tiers. The memory cube includes a thermal path structure extending through the multiple stacked tiers and connected to the base chip. The thermal path structure has a thermal conductivity larger than that of the encapsulant. The thermal path structure is electrically isolated from the semiconductor chips in the multiple stacked tiers and the base chip.

16 Claims, 23 Drawing Sheets

(51) Int. Cl.
*H01L 23/48* (2006.01)
*H01L 23/31* (2006.01)
*H01L 21/56* (2006.01)
*H01L 21/48* (2006.01)
*H01L 23/367* (2006.01)

(52) U.S. Cl.
CPC ........ *H01L 23/3107* (2013.01); *H01L 23/367* (2013.01); *H01L 25/0657* (2013.01); *H01L 2225/06548* (2013.01)

(56) References Cited

U.S. PATENT DOCUMENTS

| | | | |
|---|---|---|---|
| 9,299,649 B2 | 3/2016 | Chiu et al. | |
| 9,372,206 B2 | 6/2016 | Wu et al. | |
| 9,425,126 B2 | 8/2016 | Kuo et al. | |
| 9,443,783 B2 | 9/2016 | Lin et al. | |
| 9,461,018 B1 | 10/2016 | Tsai et al. | |
| 9,496,189 B2 | 11/2016 | Yu et al. | |
| 9,583,415 B2 * | 2/2017 | Yu | H01L 23/36 |
| 9,666,502 B2 | 5/2017 | Chen et al. | |
| 9,735,131 B2 | 8/2017 | Su et al. | |
| 10,770,430 B1 * | 9/2020 | Kim | H01L 25/18 |
| 2006/0145356 A1 * | 7/2006 | Liu | H01L 25/0657 |
| | | | 257/E23.101 |
| 2007/0023889 A1 * | 2/2007 | Salmon | G02B 6/43 |
| | | | 257/E23.072 |
| 2011/0001148 A1 * | 1/2011 | Sun | H01L 33/60 |
| | | | 257/88 |
| 2012/0025388 A1 * | 2/2012 | Law | H01L 25/0657 |
| | | | 257/773 |
| 2013/0277821 A1 * | 10/2013 | Lundberg | H01L 23/36 |
| | | | 257/713 |
| 2014/0084444 A1 * | 3/2014 | Lin | H01L 24/83 |
| | | | 438/122 |
| 2015/0155011 A1 * | 6/2015 | Schenck | G11C 5/063 |
| | | | 365/51 |
| 2019/0006549 A1 * | 1/2019 | Yim | H01L 23/367 |
| 2020/0176384 A1 * | 6/2020 | Wu | H01L 21/4857 |
| 2020/0381397 A1 * | 12/2020 | Yu | H01L 24/08 |

\* cited by examiner

MEMORY DEVICE AND MANUFACTURING METHOD THEREOF

CROSS-REFERENCE TO RELATED APPLICATION

This application claims the priority benefit of U.S. provisional application Ser. No. 62/953,502, filed on Dec. 25, 2019. The entirety of the above-mentioned patent application is hereby incorporated by reference herein and made a part of this specification.

BACKGROUND

As size downscaling and operation speed increasing, the thermal dissipation for highly integrated semiconductor packaging is an important issue and has great impact on the performance of the semiconductor devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
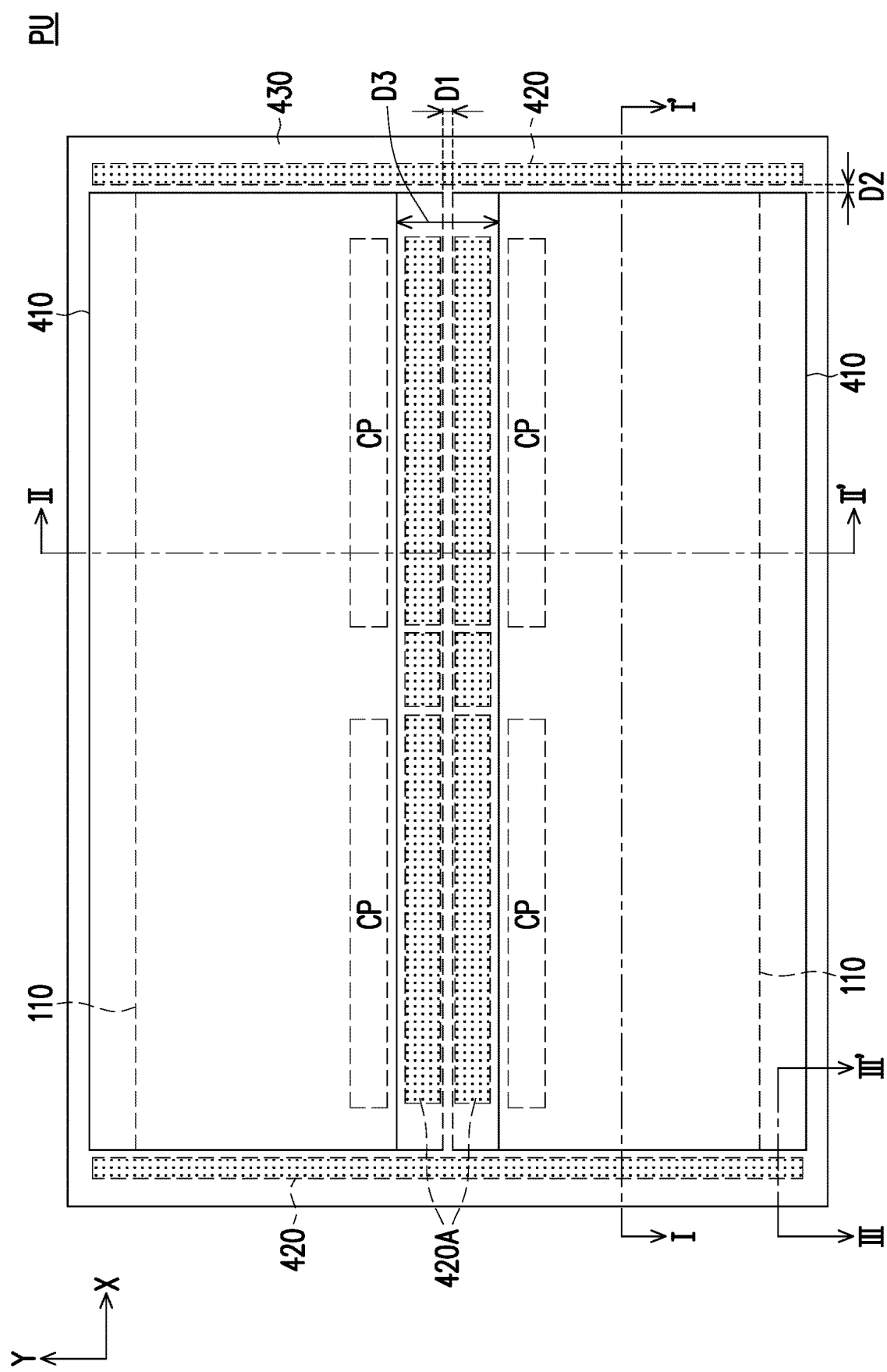
FIG. 1 is a schematic top view of a memory device according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Figure 4:
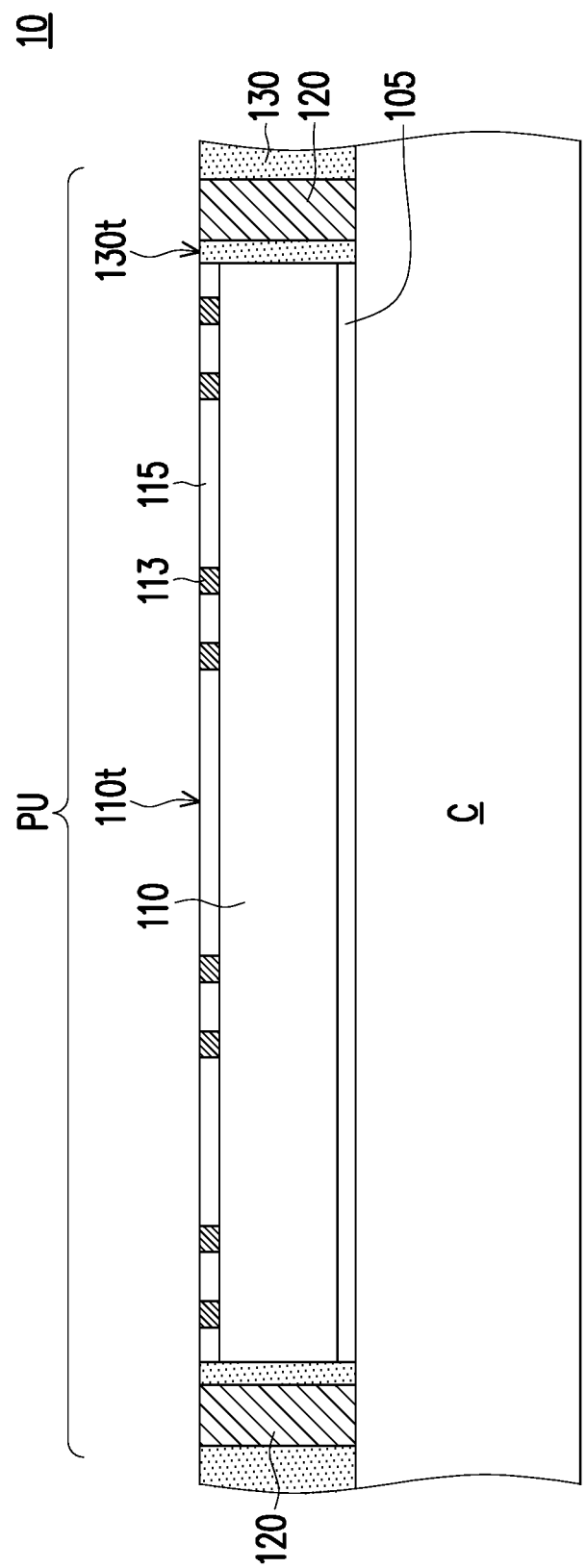
Figure 5:
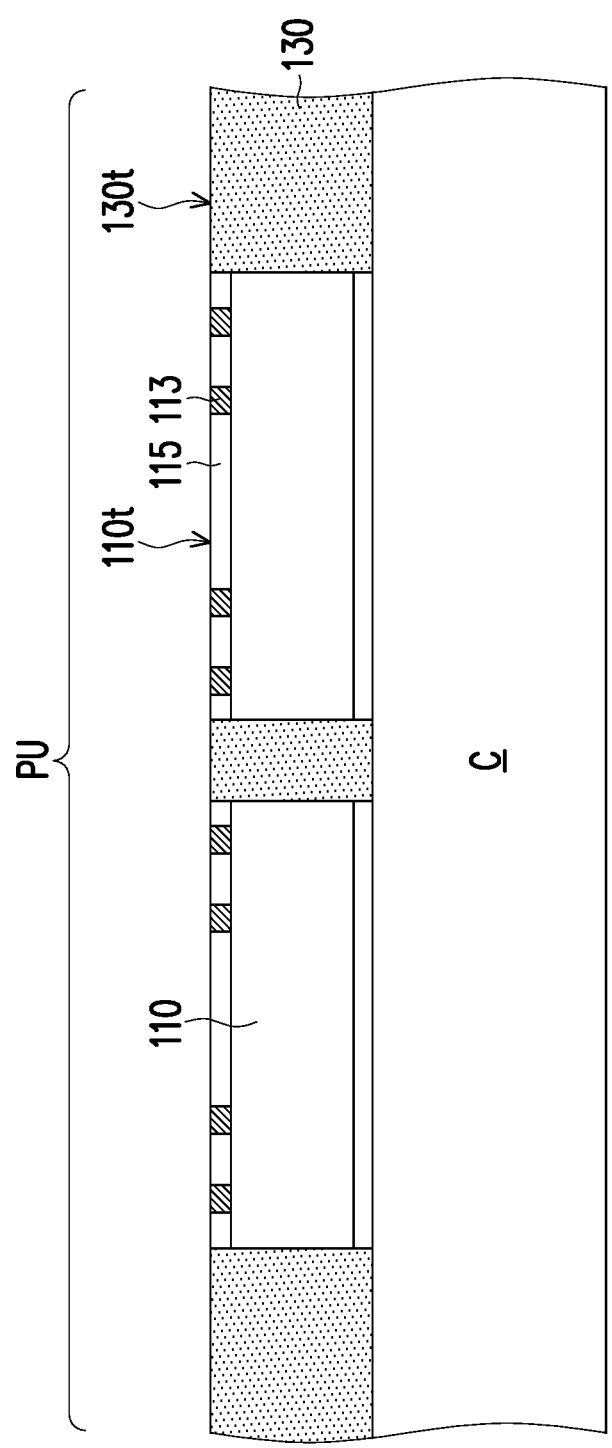

FIG. 1 is a schematic top view of a memory device according to some embodiments of the present disclosure, having I-I' and II-II' cross-section lines in the X-direction and Y-direction. FIG. 2 to FIG. 13 are schematic cross-sectional views of structures produced at various stages of a manufacturing method of a memory device according to some embodiments of the present disclosure. FIG. 1 show the exemplary structure of a memory device produced through the manufacturing method shown from FIG. 2 to FIG. 13. FIG. 2, FIG. 4, FIG. 6, FIG. 8, FIG. 10 and FIG. 12 show the schematic cross-sectional views along the I-I' cross-section line, while FIG. 3, FIG. 5, FIG. 7, FIG. 9, FIG. 11 and FIG. 13 show the schematic cross-sectional views along the II-II' cross-section line. The schematic cross-sectional views respectively along the I-I' and II-II' cross-section lines of the structure at the same stage of the manufacturing method are shown as pairs: FIG. 2 and FIG. 3, FIG. 4 and FIG. 5, FIG. 6 and FIG. 7, FIG. 8 and FIG. 9, FIG. 10 and FIG. 11 as well as FIG. 12 and FIG. 13. FIG. 14 is a schematic top view of the exemplary molded structure as shown in FIG. 4 and FIG. 5.

Figure 2:
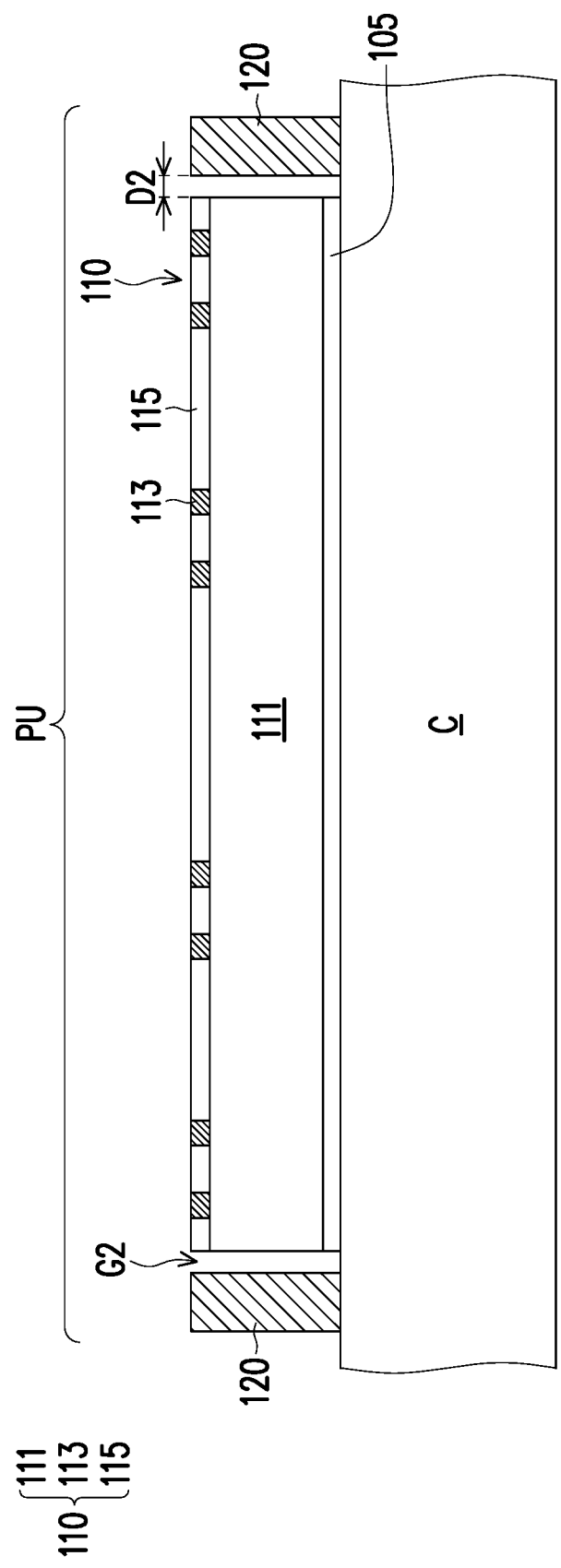
FIG. 2 to FIG. 13 are schematic cross-sectional views of structures produced at various stages of a manufacturing method of a memory device according to some embodiments of the present disclosure.
Figure 3:
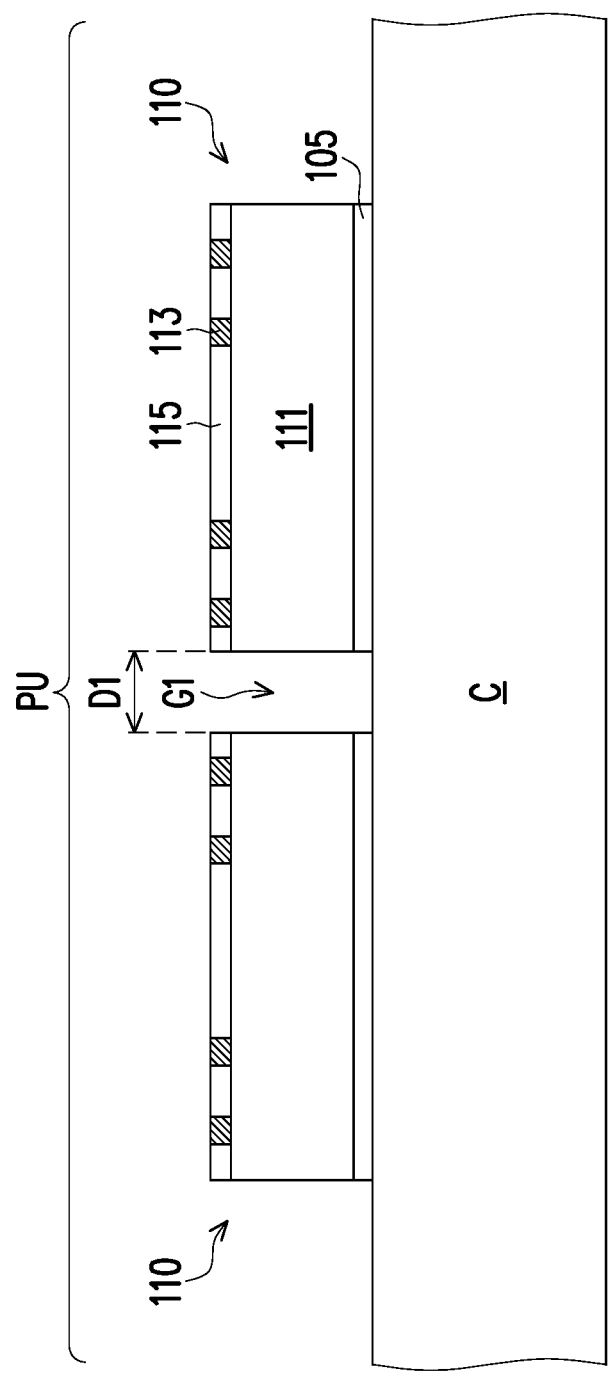

Referring to FIG. 1, FIG. 2 and FIG. 3, a carrier C is provided. In some embodiments, the carrier C is a glass substrate, a metal plate, a plastic supporting board or the like, but other suitable substrate materials may be used as long as the materials are able to withstand the subsequent steps of the process. In some embodiments, a de-bonding layer (not shown) is provided on the carrier C to facilitate peeling the carrier C away from the structure when required by the manufacturing process. In some embodiments, the de-bonding layer may include a light-to-heat conversion (LTHC) release layer.

In some embodiments, referring to FIG. 2 and FIG. 3, semiconductor chips or dies 110 are provided on the carrier C. Herein, semiconductor chips and semiconductor dies may be used interchangeably and refer to dies or chips having semiconductor integrated circuits (ICs), or hybrid integrated circuits with passive components. In some embodiments, the semiconductor chips 110 are placed onto the carrier C through a pick-and-place method and are fixed to the carrier C through a die attach film (DAF) 105. In some embodiments, two semiconductor chips 110 are arranged as one packaging unit PU using wafer-level packaging technology. Even though only two semiconductor chips 110 are presented in FIG. 3 for illustrative purposes, less or more than two semiconductor chips 110 may be provided within the packaging unit on the carrier C. In some embodiments, an individual semiconductor chip 110 includes a semiconductor substrate 111, contacts 113, and a protective layer 115. For example, the contacts 113 are formed at a top surface of the semiconductor substrate 111, and the protective layer 115 covers the top surface of the semiconductor substrate 111 but exposes the contacts 113.

In some embodiments, the semiconductor substrate 111 is made of elemental semiconductor materials, such as crystalline silicon, diamond, or germanium; compound semiconductor materials such as silicon carbide, gallium arsenic, indium arsenide, or indium phosphide or alloy semiconductor materials such as silicon germanium, silicon germanium carbide, gallium arsenic phosphide, or gallium indium phosphide. In some embodiments, the material of the contacts 113 includes copper, copper alloys, or other conductive materials, and may be formed by deposition, plating, or other suitable techniques. The protective layer 115 may be a single layer or a multi-layered structure, and may include silicon oxide, silicon nitride, silicon oxy-nitride, other suitable dielectric materials, or combinations thereof.

In some embodiments the semiconductor chips 110 are placed over the carrier C with their top surfaces facing away from the carrier C and their bottom surfaces are attached to the carrier C through the DAF 105. In some embodiments, the semiconductor chips 110 are memory chips or include memory chips or dies, and are configured as dynamic random access memories (DRAMs), resistive random access memories (RRAMs), static random access memories (SRAMs), magneto-resistive random access memories (MRAMs), ferroelectric random access memories (FRAMs), or the like.

In some embodiments, as shown in FIG. 2 and FIG. 3, the two semiconductor chips 110 (as a pair) are disposed on the carrier C side-by-side with a gap G1 there-between, and the two semiconductor chips 110 (shown in dotted lines in FIG. 1) are spaced apart with a distance D1 (in the Y-direction) ranging from about 60 microns to about 100 microns. The distance D1 is measured between two facing sides of the semiconductor chips 110. In some embodiments, the semiconductor chips 110 have a rectangular shape and the semiconductor chips 110 are arranged with the long sides in parallel with each other.

Referring to FIG. 2, in some embodiments, thermally conductive walls 120 are provided on the carrier C beside the semiconductor chips 110 and there are gaps G2 between the semiconductor chips 110 and the thermally conductive walls 120. Taking the rectangular shaped chips as an example, the thermally conductive walls 120 are located at the opposite short sides (non-facing sides) of the rectangular chips 110, and are spaced apart from the semiconductor chips 110 with a distance D2 (in the X-direction) ranging from about 60 microns to about 100 microns. Referring to the top view shown in FIG. 14, in one embodiment, the thermally conductive walls 120 have a rectangular shape and are aligned as a single line beside the pair of the semiconductor chips 110. From the top view of FIG. 14, except for the two long sides of the semiconductor chips 110 facing each other (with distance D1) being the facing sides, the other sides of the group of semiconductor chips 110 are considered as non-facing sides. The thermally conductive walls 120 are arranged at non-facing sides of the pair (or the group) of the semiconductor chips 110. However, it is understood that the thermally conductive walls 120 may be arranged as multiple lines, columns, rows or even as arrays at two opposite sides of chips or surrounding the chips, depending on the thermal dissipation requirements. In one embodiment, the thermally conductive walls 120 are of substantially the same size or dimensions and have a length (Y-direction) of about 200 microns. In some embodiments, the thermally conductive walls 120 standing on the carrier C with a height higher than or substantially equivalent to the height (the thickness direction) of the semiconductor chips 110. In some embodiments, the thermally conductive walls 120 are separate from one another and spaced apart from the adjacent thermally conductive wall(s) 120 with a uniform spacing.

In some embodiments, the material of the thermally conductive walls 120 includes metals, metal alloys or other thermally conductive materials. In some embodiments, the thermally conductive wall 120 is a metal or metallic block. In some embodiments, the thermally conductive walls 120 are blocks made of copper or copper alloys by plating or deposition. In some embodiments, the formation of the thermally conductive walls 120 includes forming a mask pattern (not shown) with openings, then forming a metallic material (not shown) filling up the openings by electroplating or deposition, and removing the mask pattern to form the thermally conductive walls 120. In some embodiments, the thermally conductive walls 120 are formed from a conductive paste including metallic particles such as a silver paste. In some alternative embodiments, a solder-based paste (i.e. eutectic solder containing lead or lead-free) is used to form the thermally conductive walls 120. In some embodiments, the silver paste or the solder-based paste may be applied on the carrier C via dispenser, screen printing or other suitable techniques, and followed by curing or reflow. In some embodiments, the thermally conductive wall 120 has a thermal conductivity equivalent to or larger than 70 watts per meter-kelvin (W/(m·K)). The material of the thermally conductive walls 120 may be chosen based on the process compatibility, the considerations of desired performances and production costs.

Referring to FIG. 4, FIG. 5 and FIG. 14, an encapsulant 130 is formed over the carrier C, covering the semiconductor chips 110 and thermally conductive walls 120. In some embodiments, as seen in FIG. 4 and FIG. 5, the encapsulant 130 at least covers the sidewalls of the semiconductor chips 110 and the sidewalls of the thermally conductive walls 120 and fills up the gaps G1 between the semiconductor chips 110 and the gaps G2 between the thermally conductive walls 120 and the semiconductor chips 110. In some embodiments, the encapsulant 130 is formed by forming an encapsulating material (not shown) over the carrier C fully covering the semiconductor chips 110 and the thermally conductive walls 120 and then planarizing the encapsulating material. In some embodiments, the encapsulating material of the encapsulant 130 includes epoxy resins, phenolic resins or other curable resin materials. In some embodiments, the encapsulating material may further include fillers. In some embodiments, the encapsulant 130 is formed through an over-molding process. In some embodiments, the encapsulant 130 is formed through a compression molding process. In some embodiments, the thermal conductivity of the thermally conductive walls 120 is at least larger than the thermal conductivity of the encapsulant 130. In some embodiments, the thermally conductive walls 120 has a thermal conductivity about 60~70 times higher than the thermal conductivity of the encapsulant 130.

Referring to FIG. 4 and FIG. 5, in some embodiments, the encapsulant 130 is formed following, for example, a planarization process, so that the top surface 130t of the encapsulant 130 is levelled with and coplanar with the top surfaces of the thermally conductive walls 120 and the semiconductor chips 110 (with the contacts 113 of the semiconductor chips 110 exposed). In some embodiments, the planarization process includes performing a mechanical grinding process and/or a chemical mechanical polishing (CMP) process. Following planarization, the contacts 113 of the semiconductor chips 110 are exposed and available for electrically connecting the semiconductor chips 110 to subsequently formed components or elements. In some embodiments, the top surfaces 110t of the semiconductor chips 110 are referred as active surfaces of the semiconductor chips 110.

In some embodiments, through the formation of the encapsulant 130, the semiconductor chips 110 and the thermally conductive walls beside the chips 110 are all molded into a molded structure 10 (similar to a reconstructed wafer structure), and the molded structure 10 includes a plurality of packaging units PU. In other words, the exemplary processes may be performed at a reconstructed wafer level, so that the plurality of units PU are processed in the form of a reconstructed wafer. In the cross-sectional views shown from FIG. 2 to FIG. 13, one packaging unit PU is shown for simplicity, but the disclosure is not limited by the embodiments or figures shown herein. In some embodiments, the semiconductor chips 110, the thermally conductive walls 120 disposed beside the chips 110, and the encapsulant 130 which laterally surrounds the semiconductor chips 110 and the thermally conductive walls 120 are considered a first tier portion of the molded structure 10.

Figure 6:
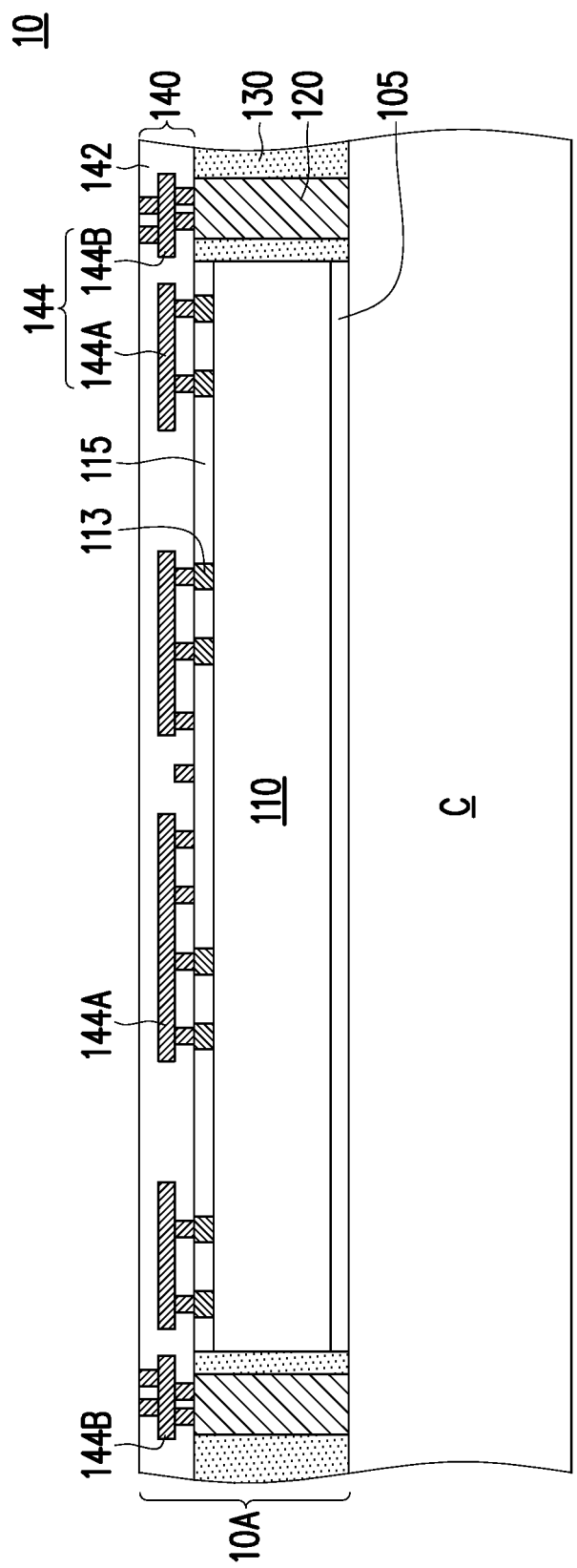
Figure 7:
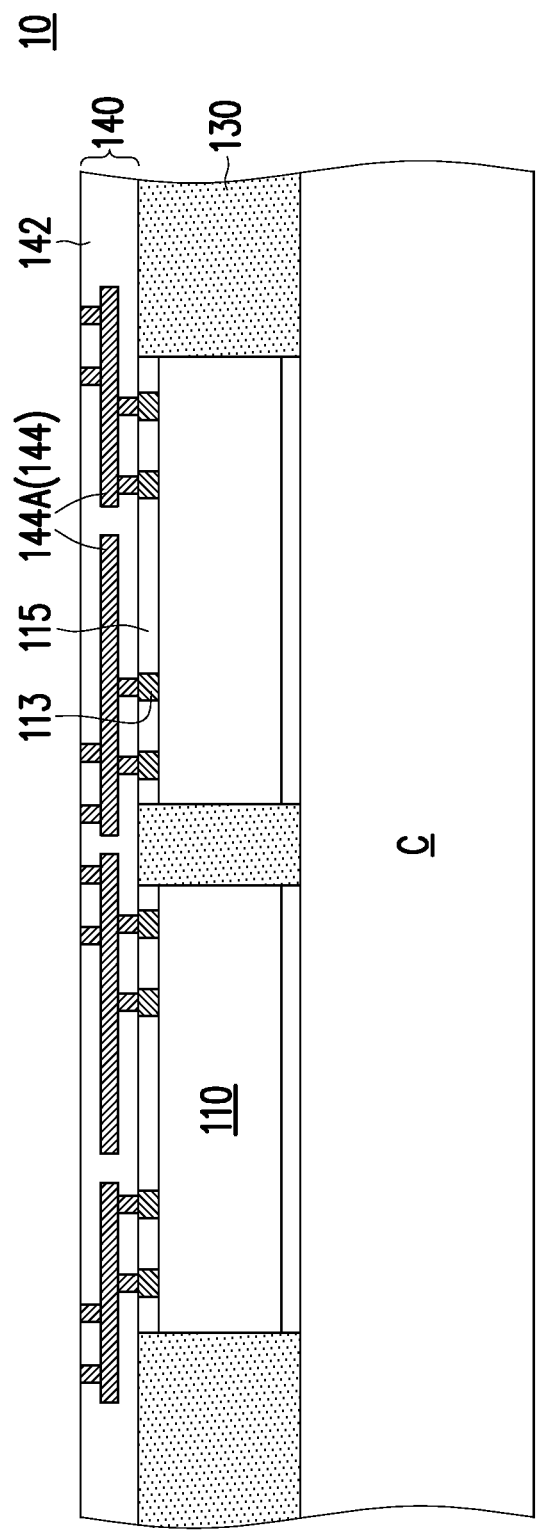

Referring to FIG. 6 and FIG. 7, in some embodiments, a redistribution structure 140 is formed on the first tier portion of the molded structure 10. In some embodiments, as seen in FIG. 6 and FIG. 7, the redistribution structure 140 includes a dielectric layer 142 and a redistribution conductive layer 144. For simplicity, the dielectric layer 142 is illustrated as a single dielectric layer and the redistribution conductive layer 144 is illustrated to include the conductive redistribution patterns embedded in the dielectric layer 142. Nevertheless, from the perspective of the manufacturing process, the redistribution structure 140 may include multiple layers of redistribution patterns, which are insulated by one or more dielectric layers. The redistribution patterns may include circuit lines extending horizontally and conductive vias extending vertically through the dielectric layers to establish electrical connection between the layers of the redistribution patterns. In some embodiments, the redistribution conductive layer 144 includes first redistribution patterns 144A that are electrically connected with the underlying semiconductor chips 110 and second redistribution patterns 144B that are physically connected to the underlying thermally conductive walls 120. In some embodiments, the first redistribution patterns 144A may extend over and beyond the spans of the semiconductor chips 110, while the second redistribution patterns 144B are mainly located right above the thermally conductive walls 120. That is, vertical projections of the second redistribution patterns 144B fall on the thermally conductive walls 120 rather than on the semiconductor chips 110. In some embodiments, the first redistribution patterns 144A may be electrically interconnected but the first redistribution patterns 144A are electrically isolated from the second redistribution patterns 144B.

As the redistribution structure 140 is formed on the first tier portion of the molded structure 10, the redistribution structure 140 is also illustrated as the first tier redistribution layer (RDL) structure and may be considered as part of the first tier 10A of the molded structure 10.

In some embodiments, the redistribution conductive layer 144 is made of a metal or metallic material, such as aluminum, titanium, copper, nickel, tungsten, silver, gold, combinations or alloys thereof. In certain embodiments, the material of the redistribution conductive layer 144 includes copper or copper alloys. The redistribution conductive layer 144 may be formed by, for example, electroplating, deposition, and/or photolithography and etching. In some embodiments, the material of the dielectric layer 142 includes polyimide, benzocyclobutene (BCB), polybenzoxazole (PBO), or any other suitable resin-based dielectric material. The dielectric layer 142, for example, may be formed by suitable fabrication techniques such as spin-on coating, chemical vapor deposition (CVD) such as plasma-enhanced chemical vapor deposition (PECVD), or the like. It should be noted that the number of layers of redistribution patterns in the redistribution conductive layer 144 and the number of the dielectric layers in the dielectric layer 142 described herein are merely for illustrative purposes, and the disclosure is not limited thereto.

Figure 8:
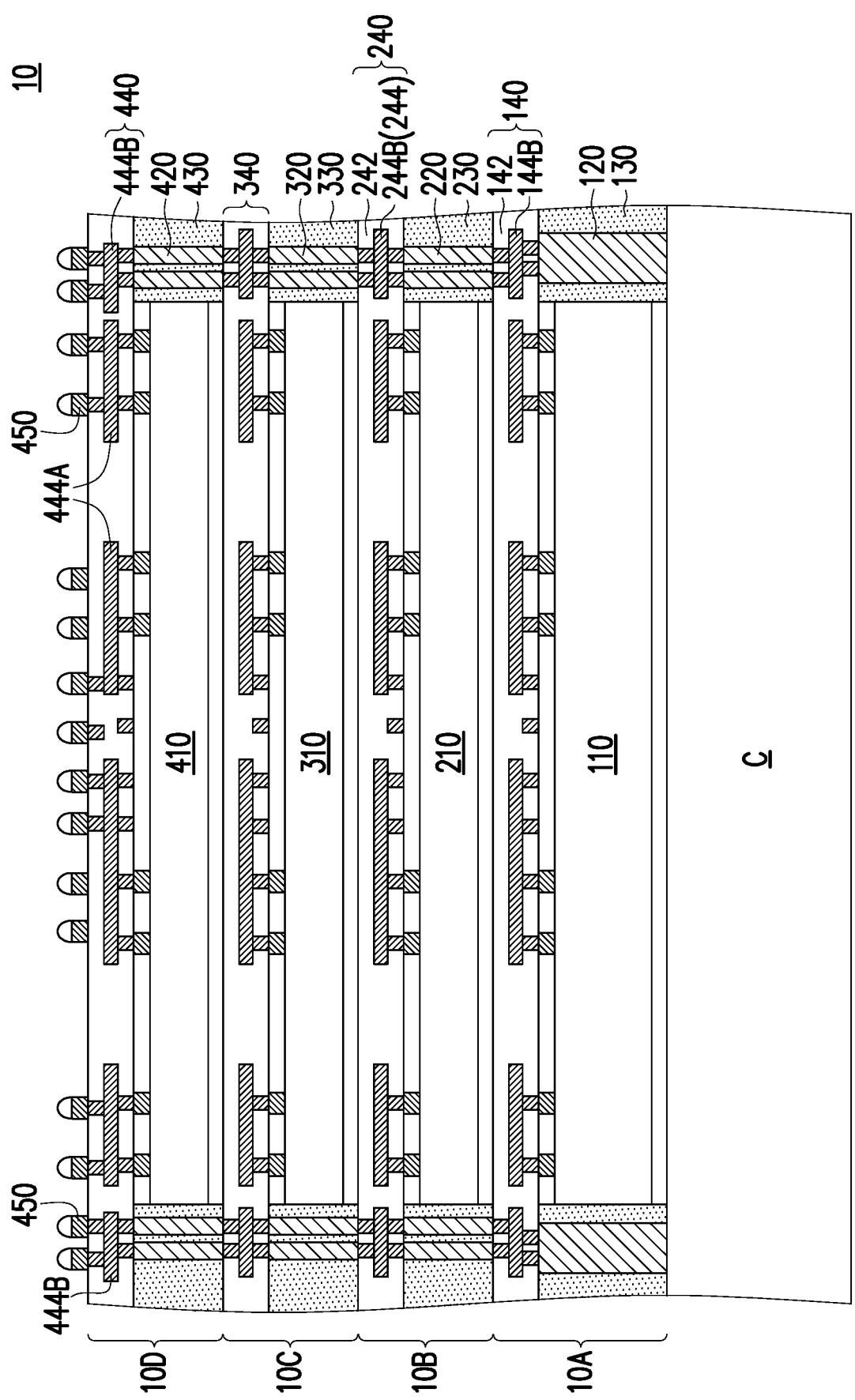
Figure 9:
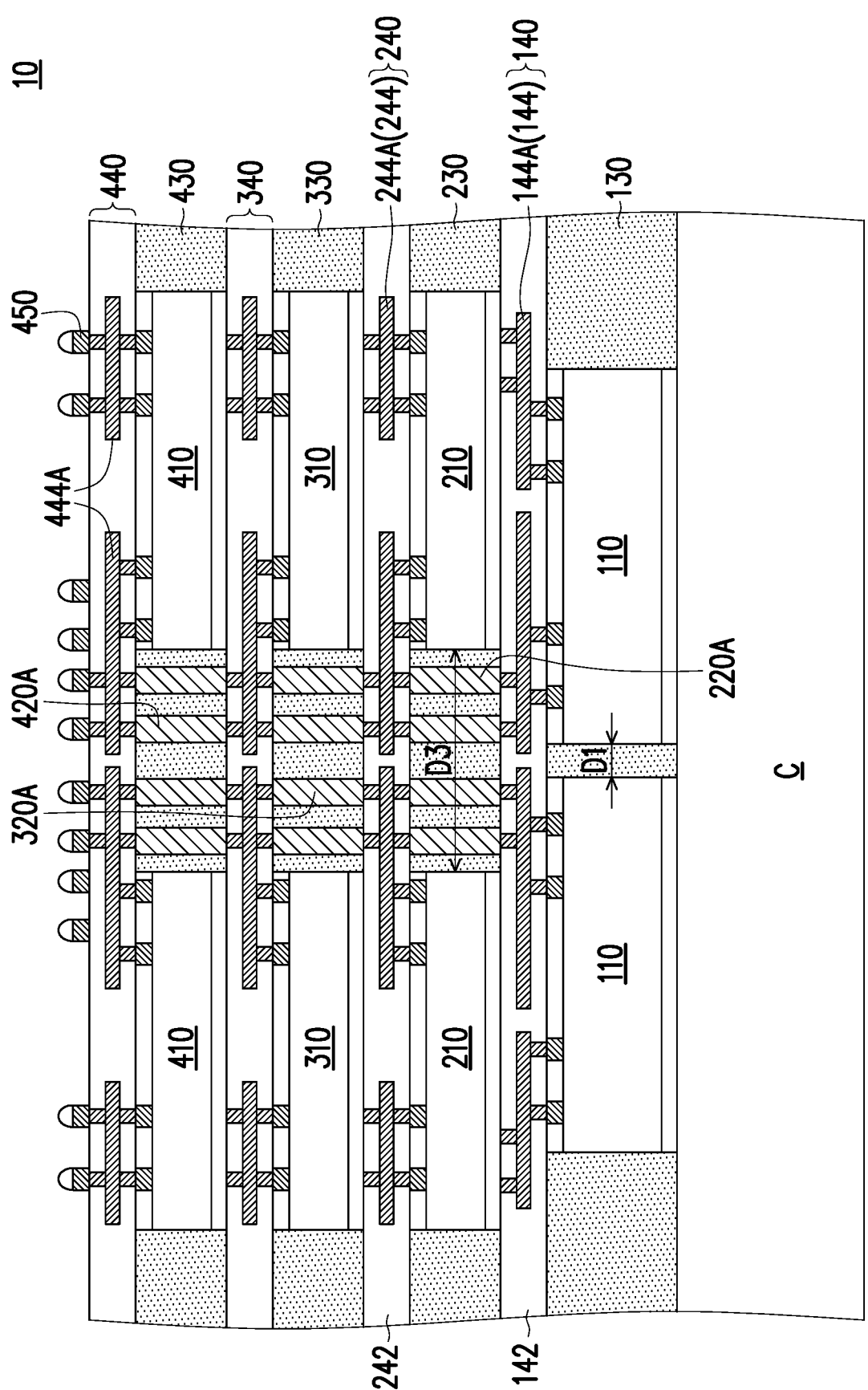

Referring to FIG. 8 and FIG. 9, in some embodiments, following the formation of the first tier 10A, similar processes and methods for forming the first tier 10A are performed in sequence and repeatedly to form the second tier 10B, third tier 10C and fourth tier 10D of the molded structure 10. After forming the redistribution structure 140, individual thermally conductive vias (TCVs) 220 and individual through insulator vias (TIVs) 220A are formed on the redistribution structure 140. In some embodiments, the TIVs 220A are of substantially the same dimensions, and the TCVs 220 are of substantially the same dimensions. In one embodiment, the TCVs 220 have a critical dimension substantially the same as that of the TIVs 220A. In some embodiments, the TIVs 220A and the TCVs 220 may have substantially the same height (in thickness direction) but are different in sizes (with different diameters). In one embodiment, the TCVs 220 have a critical dimension larger than that of the TIVs 220A. In some embodiments, the TCVs 220 are formed on and connected with the second redistribution patterns 144B. In some embodiments, the TCVs 220 directly contact the second redistribution patterns 144B, and the TCVs 220 are connected to the underlying thermally conductive walls 120 through the second redistribution patterns 144B. In some embodiments, the TIVs 220A are formed on and connected with the first redistribution patterns 144A. In some embodiments, as seen in FIG. 1, FIG. 3 and FIG. 9, the TIVs 220A are separate from one another and are arranged as one or more arrays respectively located alongside both sides of the gap G1. Later, the semiconductor chips 210 are disposed on the redistribution structure 140. As seen in FIG. 9, within one packaging unit PU, two semiconductor chips 210 are provided as a pair spaced apart from each other with a distance D3 (in the Y-direction), and the pair of semiconductor chips 210 are spaced apart from the TIVs 220A and are located beside the arrays of the TIVs 220A. The TIVs 220A are respectively located at two facing sides of the semiconductor chips 210, located between the semiconductor chips 210 and are spaced apart from the semiconductor chips 210. Taking the rectangular shaped chips as an example, the TCVs 220 are located at the opposite short sides of the rectangular chips 210, and are spaced apart from the semiconductor chips 210.

For example, when the semiconductor chips 210 and the semiconductor chips 110 are of about the same dimensions/sizes, and the distance D3 in the Y-direction is larger than the distance D1, from the top view, the X-direction extending sides of the semiconductor chips 210 are not vertically aligned with the X-direction extending sides of the semiconductor chips 110, but the Y-direction extending sides of the semiconductor chips 210 are vertically aligned with the Y-direction extending sides of the semiconductor chips 110. In other words, the vertical projections of the TIVs 220A fall on the spans of the underlying semiconductor chips 110, not overlapped with the gap G1. In some embodiments, vertical projections of the TCVs 220 fall on the spans of the corresponding thermally conductive walls 120. In some embodiments, the semiconductor chips 210 have a rectangular shape and the semiconductor chips 210 are arranged with the long sides in parallel with each other. Similarly, the semiconductor chips 210 are memory chips or include memory chips or dies. In some embodiments, the semiconductor chips 210 have substantially the same functions as the semiconductor chips 110. In some embodiments, the semiconductor chips 210 may have different functions from the semiconductor chips 110. The areas circled by the dotted lines and labeled as CP in FIG. 1 refer to the regions where the contact pads of the semiconductor chips are located.

In some embodiments, as seen in FIG. 8 and FIG. 9, multiple TIVs 220A that are located between the semiconductor chips 210 are electrically connected with the underlying semiconductor chips 110 through the first redistribution patterns 144A. In some embodiments, as seen in FIG. 9, the number of TIVs 220A in a row may be determined based on the spacing there-between, the distance D3 between the semiconductor chips 210, and the gap G1 between the semiconductor chips 110 in the first tier 10A. As seen in FIG. 1, multiple TIVs (e.g. 420A) may be disposed as arrays according to design and routing requirements. On the other hand, multiple TCVs 220 that are located beside the semiconductor chips 210 are thermally connected with the underlying thermally conductive walls 120 through the second redistribution patterns 144B. In some embodiments, as seen in FIG. 8, the number of TCVs 220 in a row may be determined based on the spacing there-between, the available distance between the semiconductor chips 210 respectively in adjacent packaging units, and the size of the thermally conductive wall 120 in the first tier 10A. In general, the TCVs 220 are connected to the underlying thermally conductive walls 120 in a multiple-to-one fashion (e.g. multiple TCVs 220 connected to one thermally conductive wall 120). It should be noted that the number of TIVs or TCVs described herein are merely for illustrative purposes, and may be varied depending on the design of redistribution patterns in the redistribution conductive layer 144, but the disclosure is not limited thereto.

In some embodiments, from the perspective of the manufacturing process, the TIVs 220A and the TCVs 220 are formed from substantially the same material through the same manufacturing process. In other words, the TCVs 220 are fabricated along with the TIVs 220A through the manufacturing process of the TIVs 220A. For example, the TIVs 220A and TCVs 220 are formed by conformally forming a seed layer (not shown) by sputtering over the redistribution structure 140, forming a mask (not shown) with openings exposing the intended locations for the subsequently formed TIVs and TCVs and then forming a metal/metallic material (not shown) by plating to fill up the openings. In the drawings of the disclosure, the seed layer may be omitted for simplicity. Alternatively, the TIVs and TCVs may be pre-fabricated (e.g., pre-fabricated copper posts), and provided on the redistribution structure 140 at pre-determined locations. It is understood that the TIVs and TCVs may be formed through other available semiconductor manufacturing processes, and the disclosure is not limited by the embodiments described herein. In some embodiments, the TIVs 220A and the TCVs 220 are made of a metal or metallic material, such as aluminum, titanium, copper, nickel, tungsten, silver, gold, combinations or alloys thereof. In certain embodiments, the material of the TIVs 220A and the TCVs 220 includes copper or copper alloys. In some embodiments, the material of the thermally conductive wall 120 is substantially the same as the material of the TCVs 220. In some other embodiments, the material of the thermally conductive wall 120 is different from the material of the TCVs 220.

Referring to FIG. 8 and FIG. 9, an encapsulant 230 is formed on the redistribution structure 140 laterally wrapping the semiconductor chips 210, the TCVs 220 and the TIVs 220A. In some embodiments, the encapsulant 230 extends in between the semiconductor chips 210, and in between adjacent TCVs 220, adjacent TIVs 220A and in between the chips 210 and the TCVs 220 and TIVs 220A. The material and the manufacturing process of the encapsulant 230 may be similar to those described above for the encapsulant 130. Later, a redistribution structure 240 is formed over the encapsulant 230, the semiconductor chips 210, the TCVs 220 and the TIVs 220A. In some embodiments, the semiconductor chips 210, the TIVs 220A, the TCVs 220, the encapsulant 230 and the redistribution structure 240 formed thereon together form a second tier 10B of the molded structure 10. Similarly, the redistribution structure 240 includes a dielectric layer 242 and a redistribution conductive layer 244. First redistribution patterns 244A and second redistribution patterns 244B of the redistribution conductive layer 244 are embedded in the dielectric layer 242. In some embodiments, the first redistribution patterns 244A are physically and electrically connected with the semiconductor chips 210 and with the TIVs 220A, and are electrically connected with the semiconductor chips 110 through the first redistribution patterns 144A. The TIVs 220A establish electrical connection between the redistribution structures 140 and 240 and, consequently, between the semiconductor chips 110 and 210. In some embodiments, the second redistribution patterns 244B are physically connected with the TCVs 220, which are further connected with the thermally conductive walls 120 through the second redistribution patterns 144B. In some embodiments, the thermal conductivity of the TCVs 220 is at least larger than the thermal conductivity of the encapsulant 230. In some embodiments, the first redistribution patterns 244A may be electrically interconnected but the first redistribution patterns 244A are electrically isolated from the second redistribution patterns 244B.

Referring to FIG. 8 and FIG. 9, the third tier 10C and the fourth tier 10D (or additional tiers) may be sequentially formed on the second tier 10B following similar manufacturing process steps. In some embodiments, TCVs 320 and TIVs 320A are provided on the redistributions structure 240 in areas respectively overlying the TCVs 220 (right above thermally conductive walls 120) and the TIVs 220A. Semiconductor chips 310 are disposed beside the TIVs 320A, and vertically aligned with the semiconductor chips 210. After forming an encapsulant 330 laterally wrapping the TIVs 320A, the semiconductor chips 320 and the TCVs 320, a redistribution structure 340 is formed thereon and the third tier 10C is formed. The TIVs 320A electrically connect the redistribution conductive layers 240 and 340. Similarly, TCVs 420, TIVs 420A and semiconductor chips 410 are provided on the redistribution structure 340 and laterally encapsulated in an encapsulant 430 and a redistribution structure 440 is formed thereon, so as to form the fourth tier 10D. In some embodiments, the TIVs 420A are vertically aligned with the TIVs 320A and 220A, and the semiconductor chips 410 are vertically stacked with the semiconductor chips 310 and 210. The semiconductor chips 410 are electrically connected with the TIVs 420A through first redistribution patterns 444A of the redistribution structure 440. The TIVs 420A electrically connect the redistribution conductive layers 340 and 440. In some embodiments, the TCVs 420 are vertically aligned with the TCVs 320 and 220. The TCVs 420, 320, 220 and the underlying thermally conductive walls 120 vertically stacked with one another form thermal paths for improving heat dissipation.

Referring to FIG. 8 and FIG. 9, in some embodiments, the semiconductor chips 410, 310 in the third tier 10C and fourth tier 10D may be arranged in pairs in correspondence of the semiconductor chips 210 in the second tier 10B. That is, the semiconductor chips 410 of the four tier 10D may be vertically aligned with the semiconductor chips 310 of the third tier 10C and with the semiconductor chips 210 of the second tier 10B. From FIG. 1 and FIG. 9, the semiconductor chips 210 of the second tier 10B at least partially overlap with corresponding underlying semiconductor chips 110 of the first tier 10A. Similarly, the semiconductor chips 410, 310 are memory chips or include memory chips or dies. In some embodiments, the semiconductor chips 410, 310 have substantially the same functions as the semiconductor chips 210. In some embodiments, the semiconductor chips 410, 310 may have different functions from the semiconductor chips 210.

In some embodiments, in FIG. 8 and FIG. 9, connectors 450 are formed on and connected with the redistribution structure 440. In some embodiments, under-bump metallurgies may be optionally formed below the connectors 450. The connectors 450 may include ball grid array (BGA) connectors, metal pillars, metal pillars with solder thereon, controlled collapse chip connection (C4) bumps, micro bump, a combination thereof, or the like. In some embodiments, the connectors 450 are micro bumps.

Similar to the previous tiers, the redistribution structure 440 includes first redistribution patterns 444A and second redistribution patterns 444B, and the first redistribution patterns 444A may be electrically interconnected but the second redistribution patterns 444B are electrically isolated from the first redistribution patterns 444A. Some of the connectors 450 are physically and electrically connected with first redistribution patterns 444A (connected with TIVs 420A), and function as electrical terminals for the underlying semiconductor chips. That is, the semiconductor chips 110, 210, 310, 410 in the packaging unit PU are electrically connected via the TIVs 220A, 320A, 420A along with the redistribution structures 140, 240, 340, 440, and some connectors 450 that are connected to the first redistribution patterns 444A are electrically connected to the semiconductor chips 110, 210, 310, 410 through the TIVs 420A, 320A, 220A as well as the redistribution structures 140, 240, 340, 440.

In the embodiments, the TIVs 220A, 320A, 420A located between the semiconductor chips mainly function for electrical connection. However, it is understood that the top tier semiconductor chips 110 and the TIVs 220A, 320A, 420A located under the chips 110 together also assist heat dissipation for the regions situated between the semiconductor chips under certain circumstances.

On the other hand, some of the connectors 450 that are connected with the second redistribution patterns 444B (connected with TCVs 420) function as part of the thermal paths, rather than for electrical connection. In some embodiments, in FIG. 8 and FIG. 9, the vertically connected structures, including TCVs 420, 320, 220 and the underlying thermally conductive walls 120, the second redistribution patterns there-between and the connectors 450 that are located on the second redistribution patterns, form thermal paths for assisting heat dissipation. The thermal path structures (vertically connected structures mainly including TCVs 420, 320, 220 and the underlying thermally conductive walls 120) are electrically isolated from the semiconductor chips since they are connected through the second redistribution patterns in the redistribution structure of each tier, and the second redistribution patterns are not electrically connected with the first redistribution patterns in the same redistribution structure and the semiconductor chips.

Figure 10:
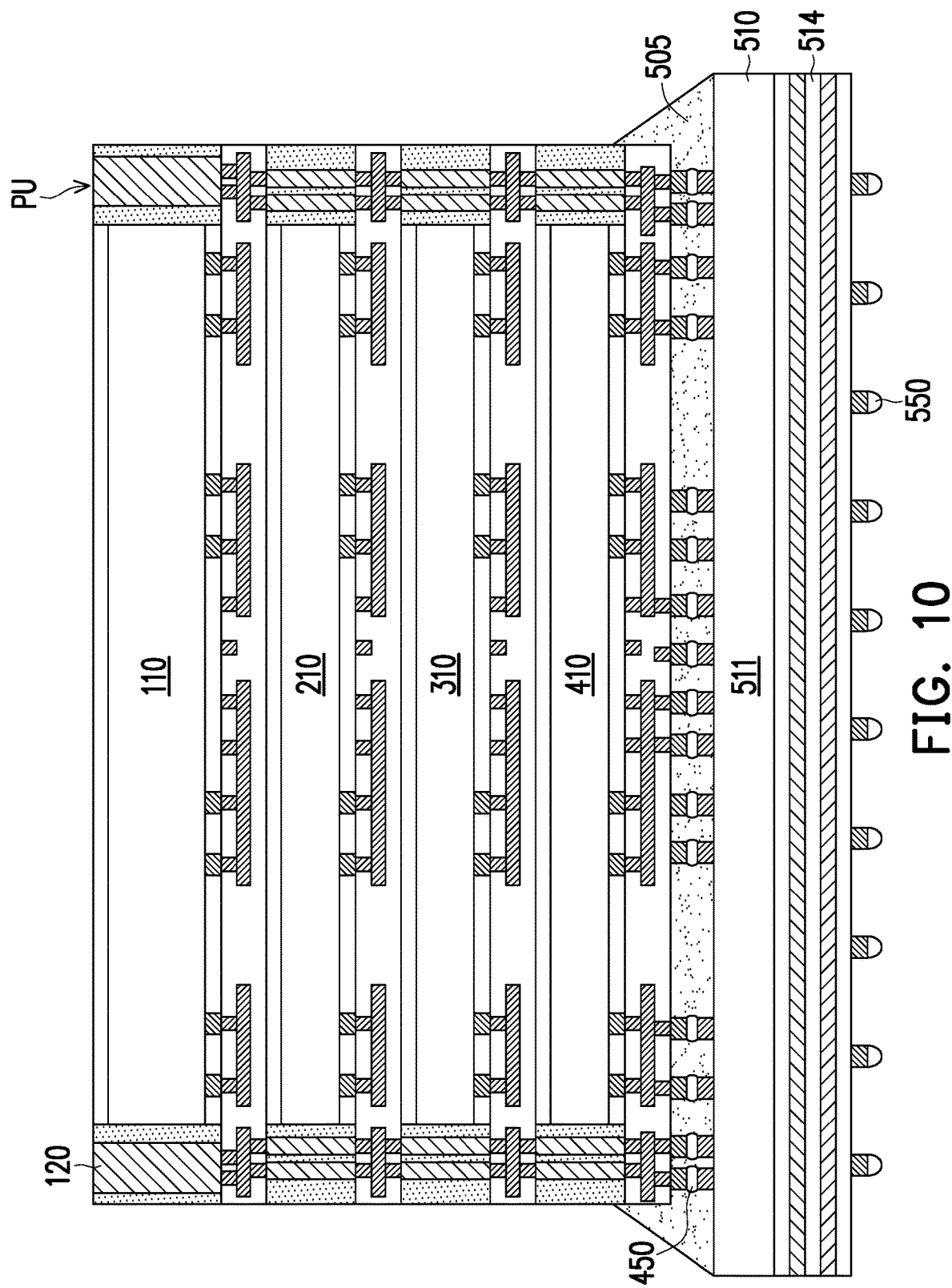
Figure 11:
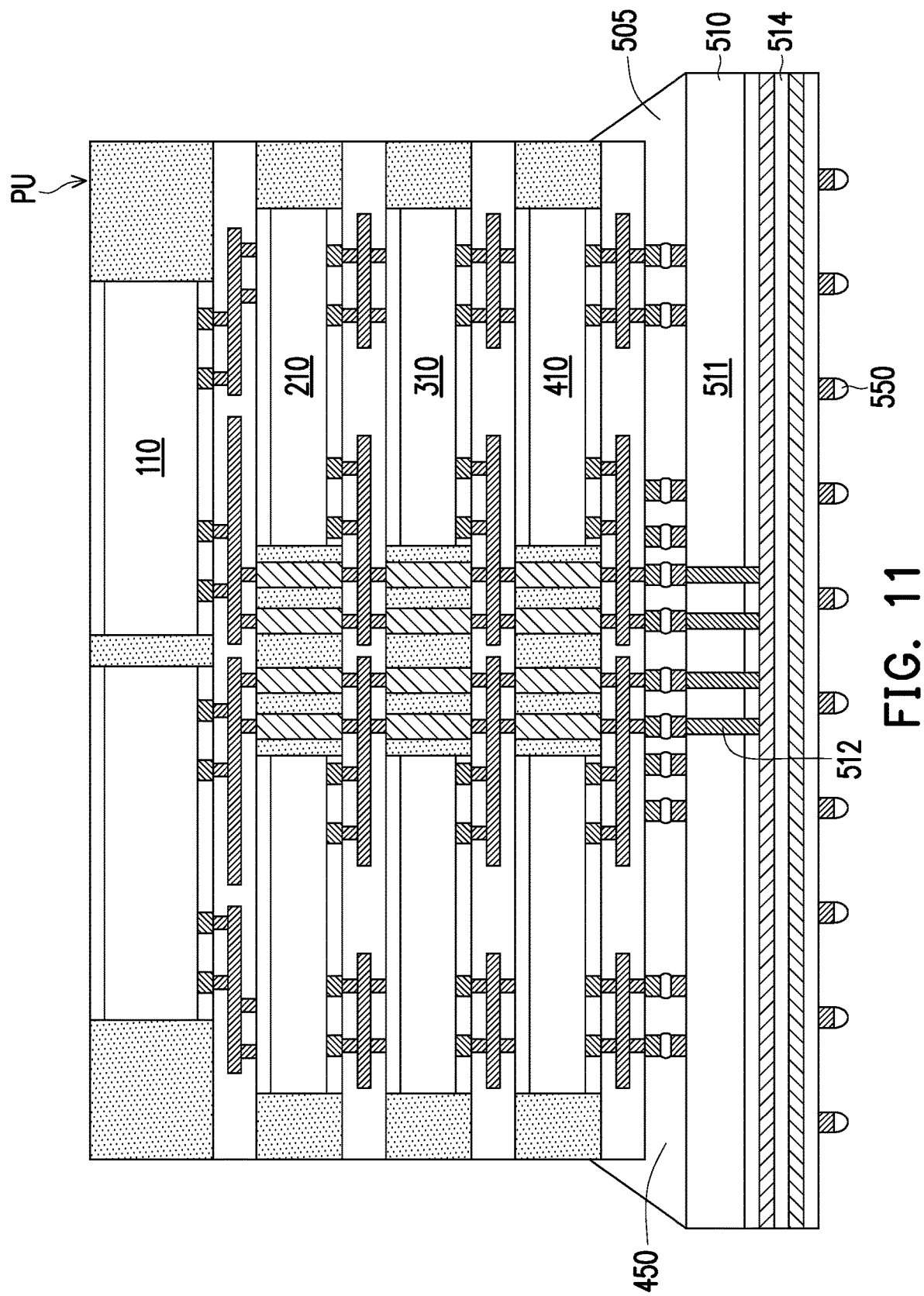

In some embodiments, referring to FIG. 10 and FIG. 11, after formation of the connectors 450, by cutting through the encapsulants 130, 230, 330, 430, the molded structure 10 may be singulated or diced into individual packaging units PU. After the singulation process, the TCVs 420, 320, 220 and the thermally conductive walls 120 are located in the peripheral region of the packaging unit PU. In some embodiments, after removing the carrier C, the packaging unit PU is obtained. The top view of FIG. 1 schematically shows the relative positional relationships for the TIVs 420A, TCVs 420 and semiconductor chips 410, 110 in the singulated packaging unit PU before it is flipped, and certain redistribution structures and connectors are omitted for illustrative purposes. In some embodiments, after removing the carrier C, in FIG. 10 and FIG. 11, the exposed surfaces (top surfaces) of the thermally conductive walls 120 are substantially coplanar with and levelled with the exposed surface of the encapsulant 130. In some embodiments, the packaging unit PU includes multiple tiers 10A-10D of stacked semiconductor chips 110, 210, 310, 410 encapsulated by respective encapsulants 130, 230, 330, 430, and redistribution structures 140, 240, 340, 440 for electrically connecting the semiconductor chips 110, 210, 310, 410. In some embodiments, when one or more of the stacked semiconductor chips 110, 210, 310, 410 are or include memory chips, the packaging unit PU may be referred to as a memory cube. In some embodiments, the memory cube(s) may function as a memory device.

In some embodiments, the semiconductor chips 210, 310, 410 may be disposed in aligned locations of the corresponding tiers and the semiconductor chips 110 may be disposed in locations vertically partial-overlapped with those of the corresponding semiconductor chips 210, 310, 410. The packaging unit PU is then flipped (turned upside down) and placed on a base chip 510. In some embodiments, referring to FIG. 10 and FIG. 11, the packaging unit PU is connected to the base chip 510 through the connectors 450 bonded to the contact pads of the base chip 510, and an underfill 505 is formed between the packaging unit PU and the base chip 510 and between the connectors 450. The underfill 505 may physically protect the connection between the connectors 450 and the contact pads of the base chip 510. Referring to FIG. 10 and FIG. 11, in some embodiments, the base chip 510 is or includes a logic chip, such as a controller chip or a chip or die with processing circuits. It is understood that one, two, three, four or more memory cubes may be mounted and bonded to the base chip/die, and the disclosure is not limited by the drawings. In some embodiments, the base chip 510 includes a semiconductor substrate 511, through substrate vias (TSVs) 512, and interconnection layers 514. The base chip 510 has a larger footprint than the packaging unit PU (i.e. memory cube). Conductive terminals 550 are provided on the bottom surface of the base chip 510 for further electrical connection. In some embodiments, under-bump metallurgies may be optionally formed below the conductive terminals 550. The conductive terminals 550 may include ball grid array (BGA) connectors, metal pillars, metal pillars with solder thereon, controlled collapse chip connection (C4) bumps, micro bump, a combination thereof, or the like. In some embodiments, the conductive terminals 550 are C4 bumps. In some embodiments, the TSVs 512 are arranged in a region of the base chip 510 corresponding to the region where the TIVs 220A, 320A, 420A are located, for electrical connection. The semiconductor chips in the packaging unit PU are electrically connected with the base chip 510 through its contact pads and the connectors 450 there-between, and are further electrically connected with the conductive terminals 550 through the TSVs 512 and the interconnection layers 514. On the other hand, the thermally conductive walls 120 and the underlying TCVs 220, 320, 420 are thermally connected with the base chip 510 through its contact pads and the connectors 450 there-between, but are not electrically connected with the base chip 510. The thermal path structures (the vertically connected structures mainly including TCVs 420, 320, 220 and the underlying thermally conductive walls 120) are electrically isolated from the semiconductor chips 110, 210, 310, 410 of the memory cube as well as the base chip 510.

As the thermal path structures vertically extend through the memory cube and are connected with the base chip, heat generated in the base chip during operation may be dissipate through the thermal paths (through the thermal path structures) to the upper or top tier, or then dissipated to the outer or external environment.

Figure 12:
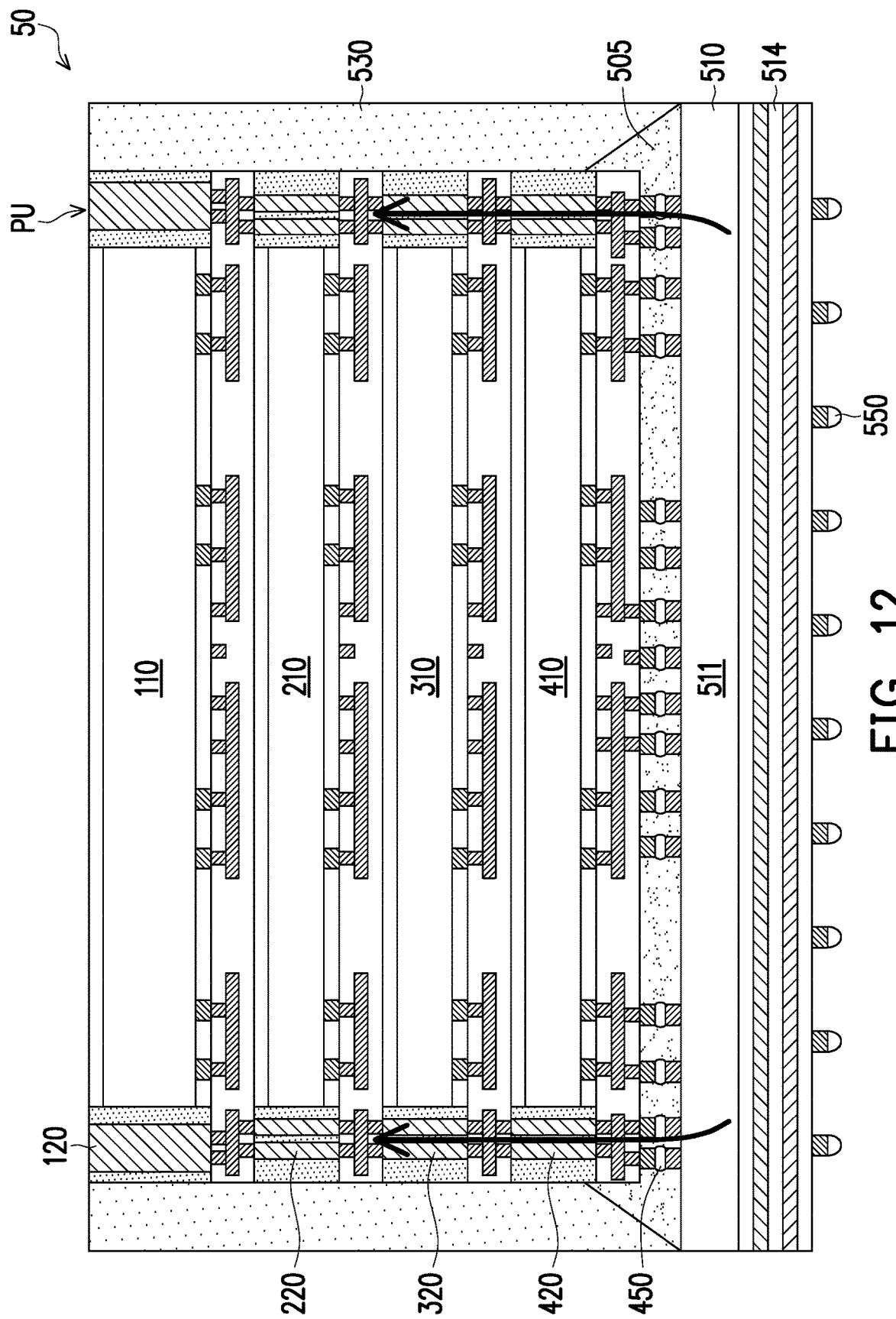
Figure 13:
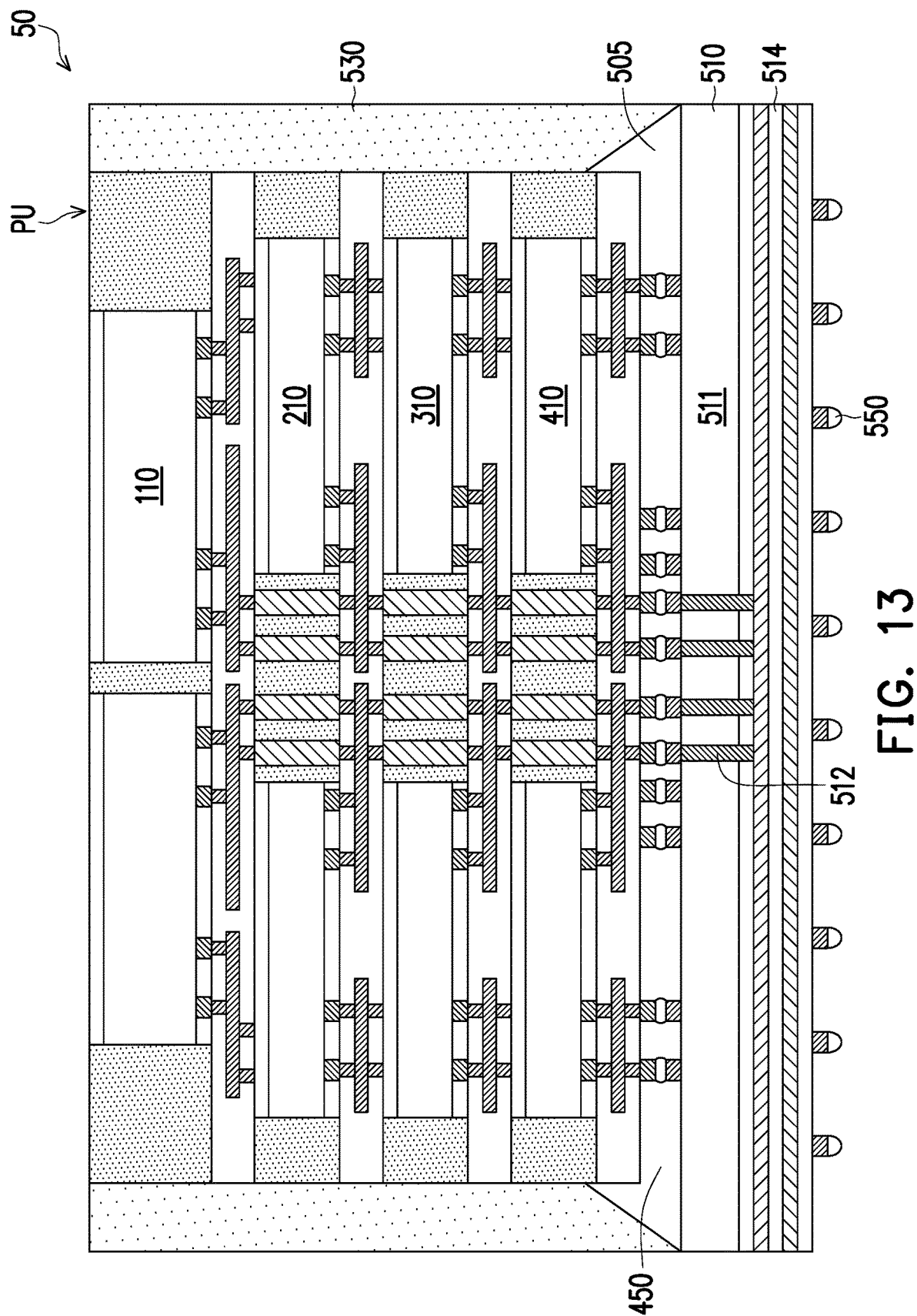
Figure 14:
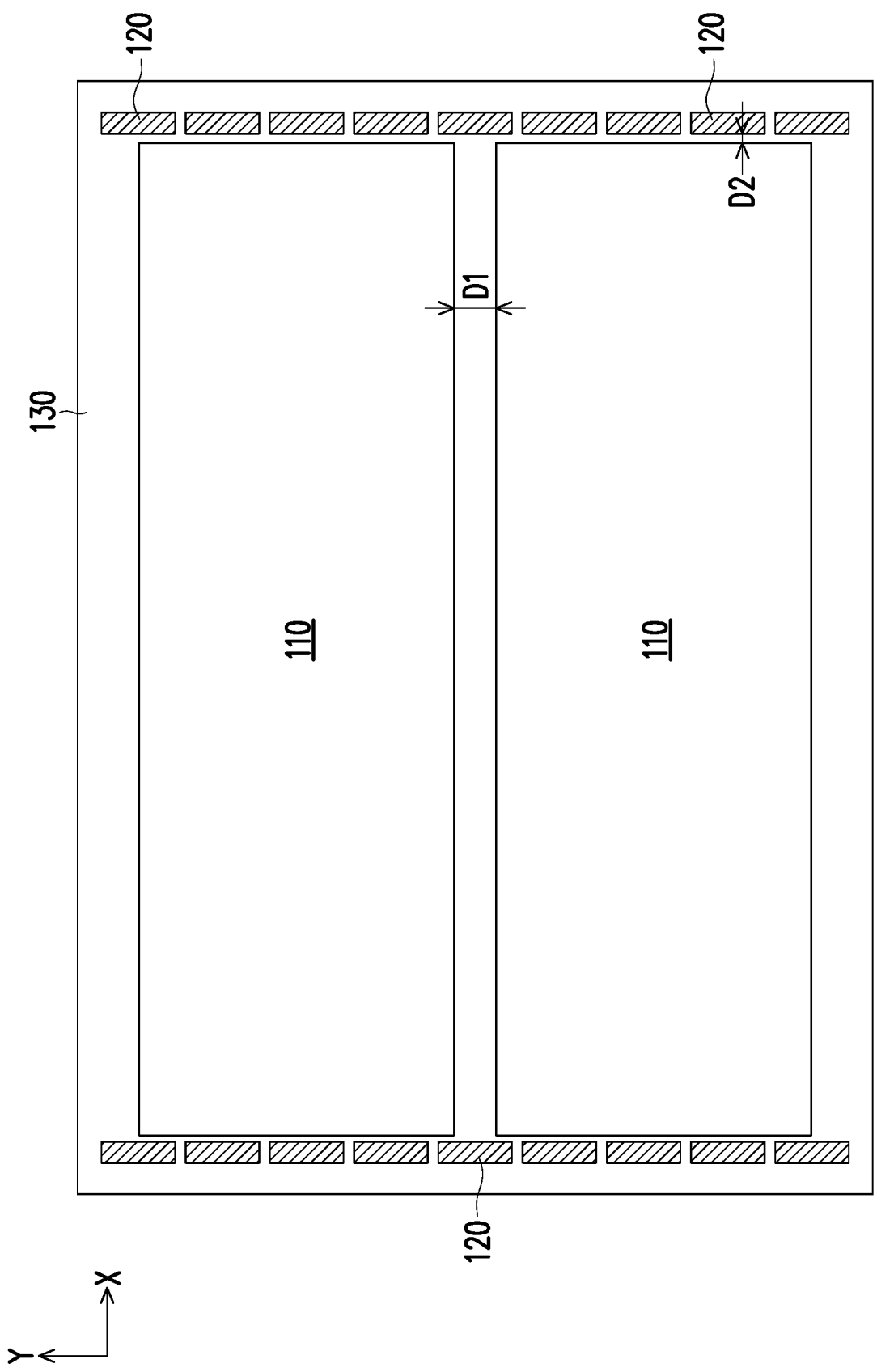
FIG. 14 is a schematic top view showing an exemplary intermediate structure of a memory device according to some embodiments of the present disclosure.

In some embodiments, referring to FIG. 12 and FIG. 13, the memory device 50 is completed by further forming a molding compound 530 to laterally wrap the packaging unit PU bonded to the base chip 510. In some embodiments, the material of the molding compound 530 includes epoxy resins, phenolic resins or other curable resin materials, and may further include fillers. In some embodiments, the molding compound 530 is formed through an over-molding process. In some embodiments, the molding compound 530 is formed through a compression molding process. In one embodiment, the material of the molding compound 530 is different from one of the encapsulants 130, 230, 330, 430. In one embodiment, the material of the molding compound 530 is substantially the same as one of the encapsulants 130, 230, 330, 430. Subsequently, the memory device 50 may be connected to a circuit substrate, a printer circuit board or even integrated with other devices via the conductive terminals 550. Also, a heat sink or cooling module (not shown) may be optionally mounted onto the top surface of memory device 50 during applications.

In some embodiments, when the memory device 50 is in operation, heat generated during operation may be more easily conveyed or dissipated through the thermal path structures constructed by the additional thermally conductive walls and TCVs arranged around and beside the semiconductor chips (arranged within the peripheral regions of the memory device). The formation of thermal paths (represented by the arrows shown in FIG. 12) helps to guide the heat generated from the base chip through thermal paths to the upper tiers and further to the heat sink or cooling module, which significantly improves the heat dissipation of the memory device 50. Through the formation of the thermal path structures, the thermal resistance of the memory device is at least reduced by about 2%, and may be further reduced by about 43%, depending on the hot spot locations of the base chip/die. As a result, the reliability of the memory device 50 is enhanced and the performance of the memory device 50 is boosted.

Figure 15:
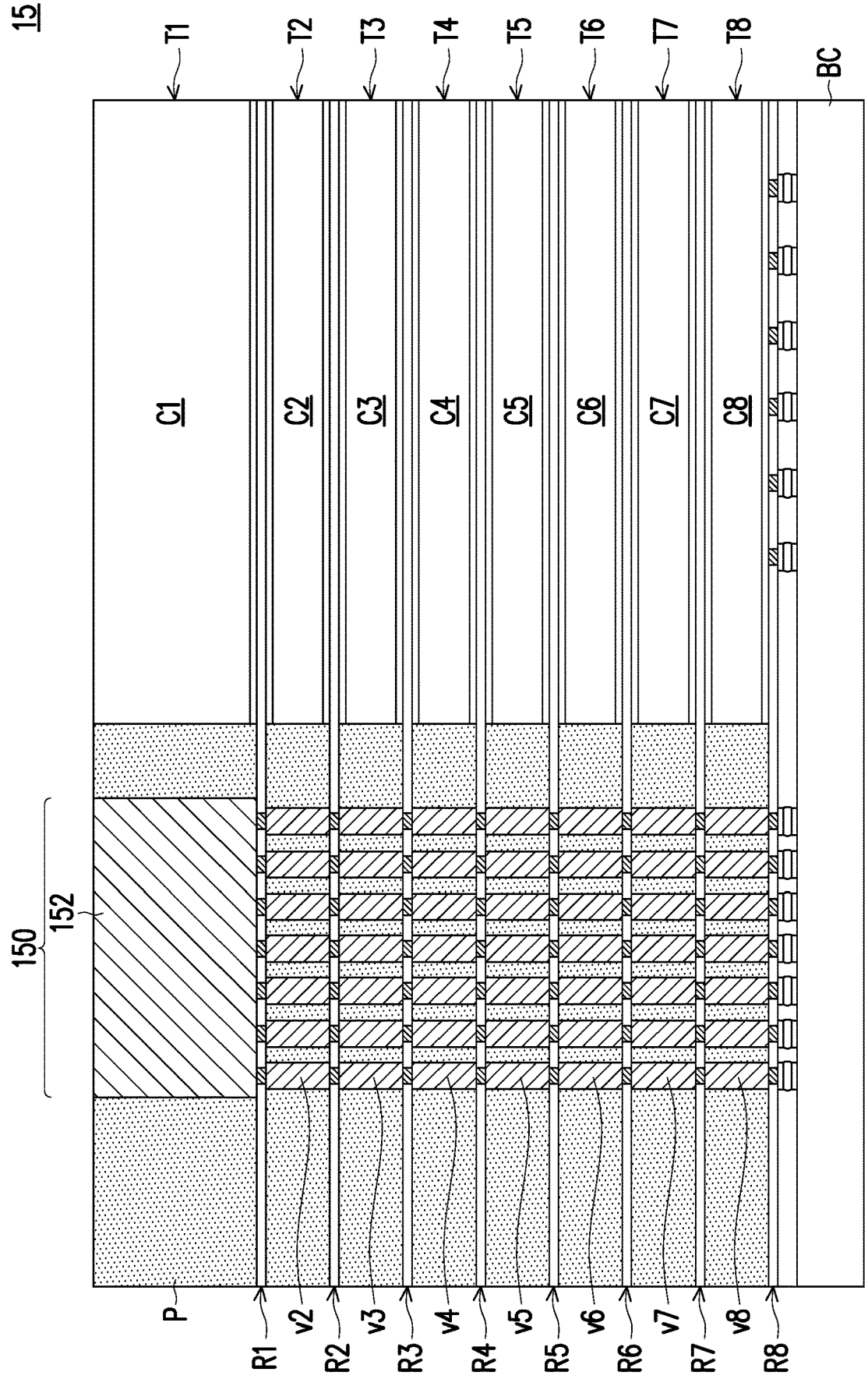
FIG. 15 to FIG. 17 are enlarged schematic cross-sectional views showing a portion of the exemplary structure(s) of a memory device according to embodiments of the present disclosure.
Figure 16:
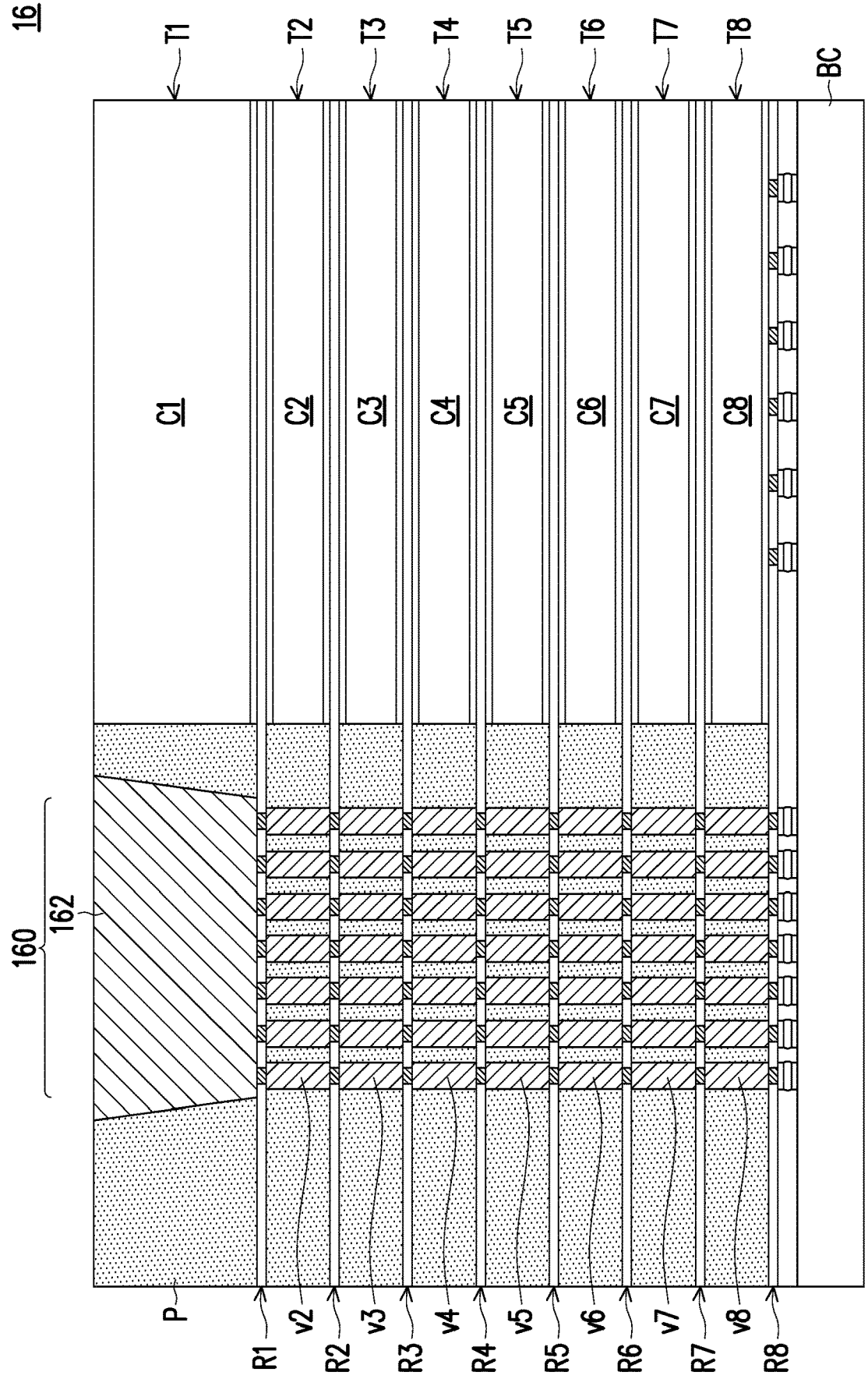
Figure 17:
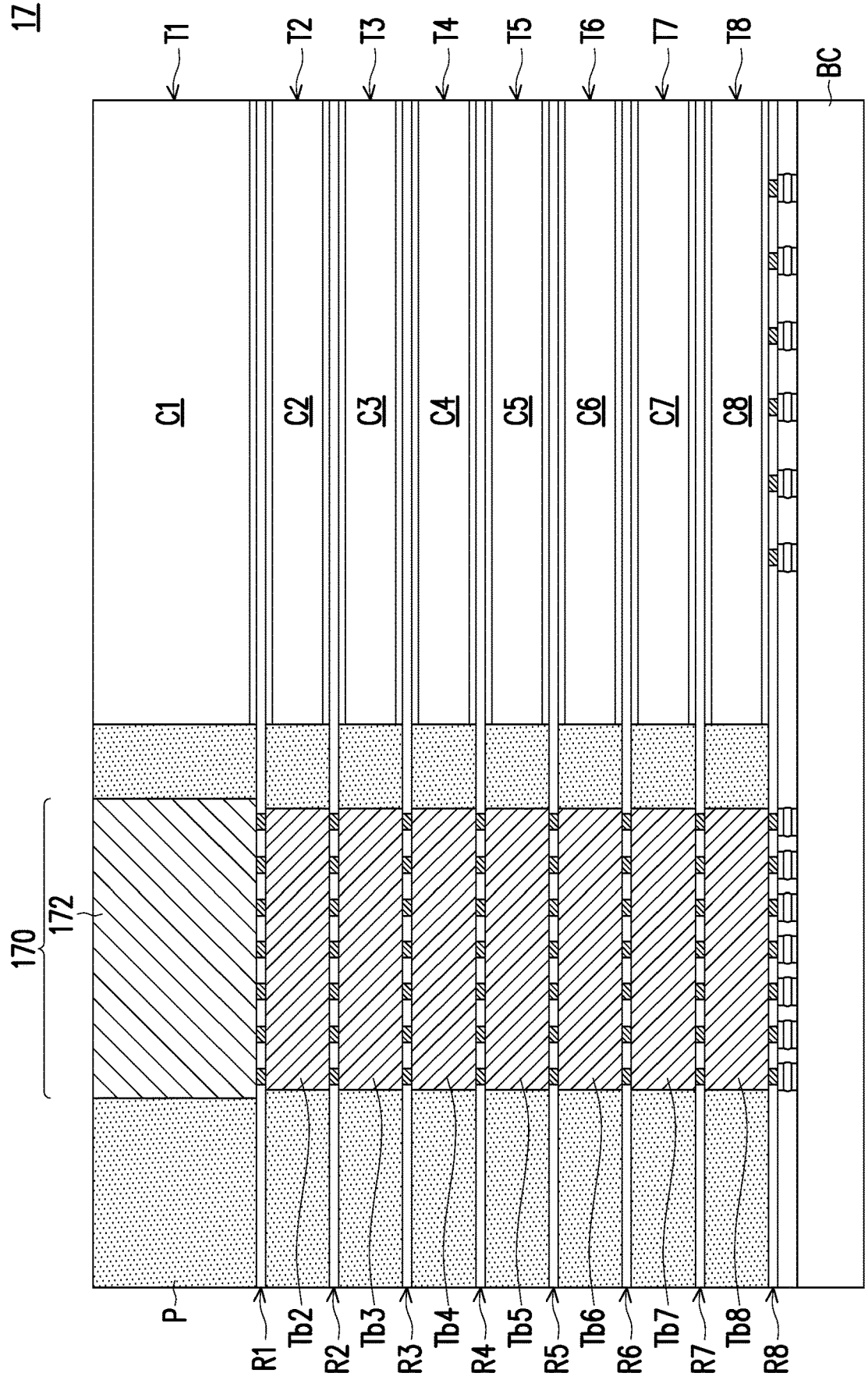

FIG. 15 to FIG. 17 are enlarged schematic cross-sectional views showing a portion of the exemplary structure(s) of a memory device according to embodiments of the present disclosure.

In FIG. 15, the memory device 15 may be formed following the previous described processes, eight tiers T1-T8 are sequentially formed, and each tier is formed with semiconductor chips C1-C8 and redistribution structures R1-R8. In some embodiments, each of the tiers T2-T8 is formed with TIVs (not shown) and TCVs v2-v8, but the top tier T1 is formed with thermally conductive walls 152 rather than TCVs. The stacked tiers T1-T8 are mounted on and bonded with the base chip BC. In some embodiments, the thermal path structure 150 includes at least the thermally conductive wall 152 and the underlying TCVs v2-v8. In FIG. 15, the thermally conductive wall(s) 152 is connected to the underlying the TCVs v2-v8 in a one-to-multiple fashion (e.g. one thermally conductive wall 152 connected to multiple TCVs v2-v8). It is understood that there are redistribution patterns located between the thermally conductive wall(s) 152 and the TCVs v2 and between the TCVs v2-v8, and only the vias of the redistribution patterns are shown in the figures for simplicity. In some embodiments, the thermally conductive wall 152 has a thermal conductivity larger than that of the encapsulant P. In some embodiments, the thermally conductive wall 152 has a thermal conductivity equivalent to or larger than 70 watts per meter-kelvin (W/(m·K)) or larger than 140 W/(m·K). In some embodiments, the thermally conductive wall 152 is a metal or metallic block. In some embodiments, the material of the thermally conductive walls 152 includes copper or copper alloys. In one embodiment, the thermally conductive wall 152 is a copper block having a thermal conductivity of about 400 watts per meter-kelvin (W/(m·K)).

In FIG. 16, the memory device 16 has a structure similar to the memory device 15, except for the thermally conductive wall(s) 162 may be formed by a different process and/or with a different material. The thermally conductive wall(s) 162 are not formed during the formation of the top tier T1 but are formed after the formation of all the tiers T1-T8 and the removal of the carrier. After removing the carrier exposing the encapsulant P of the top tier T1, trenches are formed in the encapsulant P by laser drilling or etching, and then a conductive paste (not shown) is filled into the trenches to form the thermally conductive walls 162 in the top tier T1. In some embodiments, the conductive paste for forming the thermally conductive walls 162 includes a silver paste. In some alternative embodiments, the conductive paste for forming the thermally conductive walls 162 includes a solder-based paste (i.e. eutectic solder containing lead or lead-free). In some embodiments, the thermal path structure 160 includes at least the thermally conductive wall 162 and the underlying TCVs v2-v8. In some embodiments, the thermally conductive wall 162 has a thermal conductivity larger than that of the encapsulant P. In some embodiments, the thermally conductive wall 162 has a thermal conductivity equivalent to or larger than 70 watts per meter-kelvin (W/(m·K)) or larger than 140 W/(m·K). It is understood that the thermally conductive wall 162 may be formed with substantially vertical sidewalls or slightly sloped sidewalls, depending on the method used for forming the trenches.

In FIG. 17, the memory device 17 has a structure similar to the memory device 15, except for the TCVs v2-v8 in each of the tiers T2-T8 are formed integrally and integrated into one block structure Tb2-Tb8. In FIG. 17, the thermally conductive blocks Tb2-Tb8 in the tiers T2-T8 are vertically aligned. In some embodiments, the thermal path structure 170 includes at least the thermally conductive wall 172 and the underlying thermally conductive blocks Tb2-Tb8. In some embodiments, the thermally conductive wall(s) 172 of the top tier T1 is connected to the underlying thermally conductive blocks Tb2-Tb8 in the tiers T2-T8 in a one-to-one fashion (e.g. one thermally conductive wall 172 connected to one block Tb2-Tb8 in one tier). It is understood that there are redistribution patterns located between the thermally conductive wall(s) 172 and the block(s) Tb2 and between the thermally conductive blocks Tb2-Tb8 in the tiers T2-T8, and only the vias of the redistribution patterns are shown in the figures for simplicity. In some embodiments, the thermally conductive wall 152 has a thermal conductivity larger than that of the encapsulant P. In some embodiments, the thermally conductive wall 152 has a thermal conductivity equivalent to or larger than 70 watts per meter-kelvin (W/(m·K)) or larger than 140 W/(m·K). In some embodiments, the material of the thermally conductive blocks Tb2-Tb8 includes a metal or a metallic material. In some embodiments, the material of the thermally conductive blocks Tb2-Tb8 includes copper or copper alloys.

Figure 18:
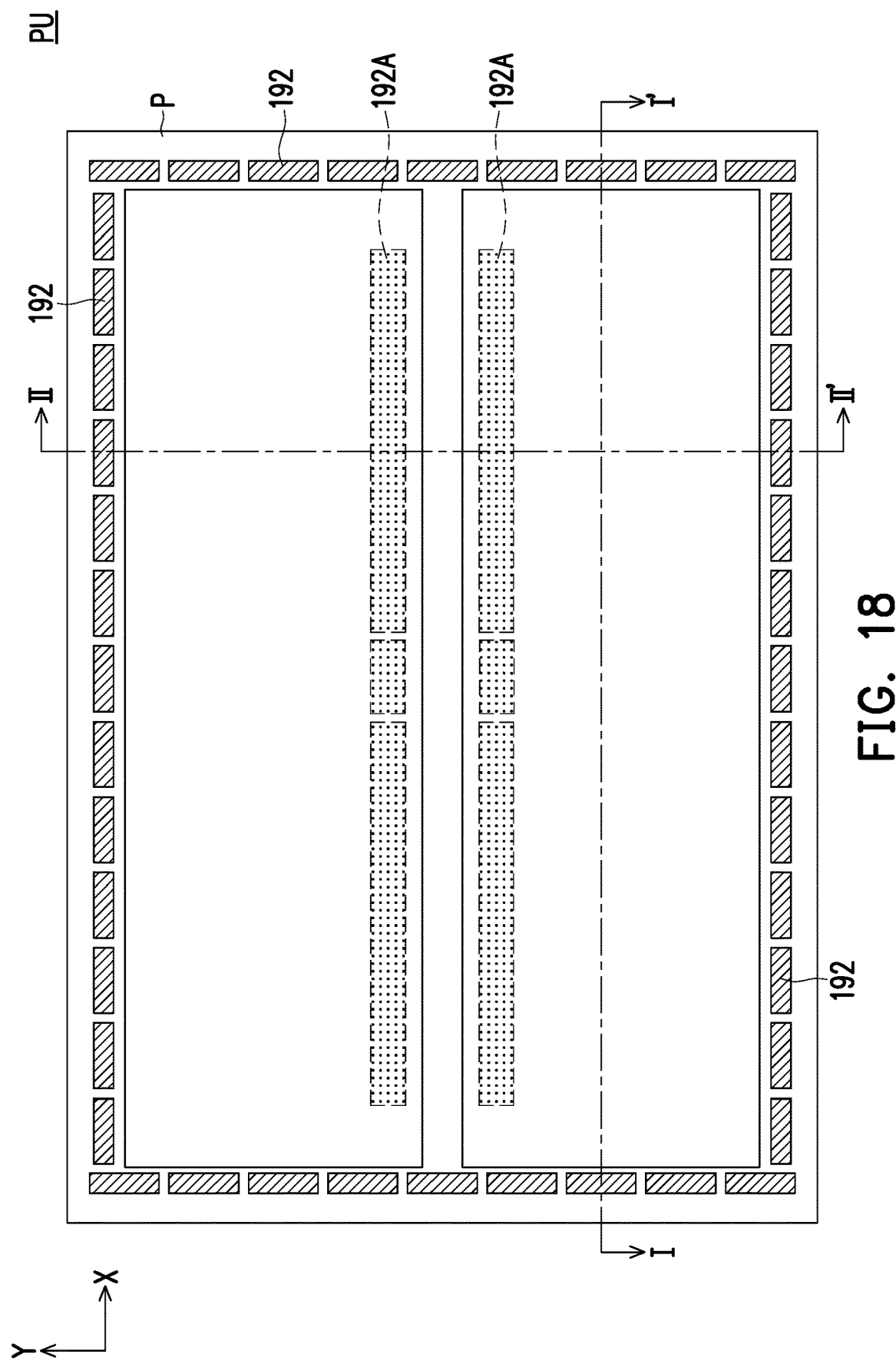
FIG. 18, FIG. 19 and FIG. 20 are schematic top and cross-sectional views showing the exemplary structure of a memory device according to some embodiments of the present disclosure.
Figure 19:
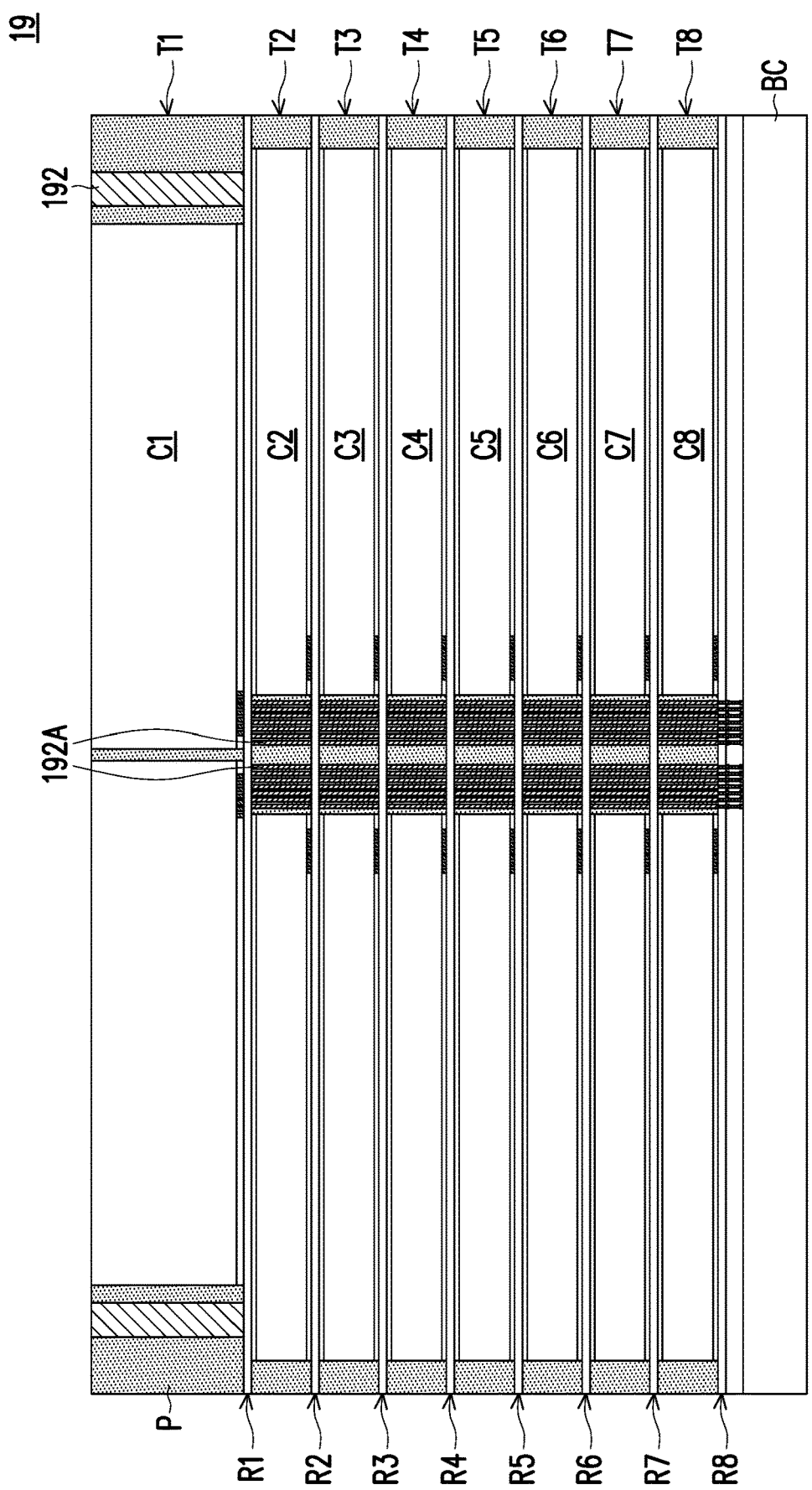
Figure 20:
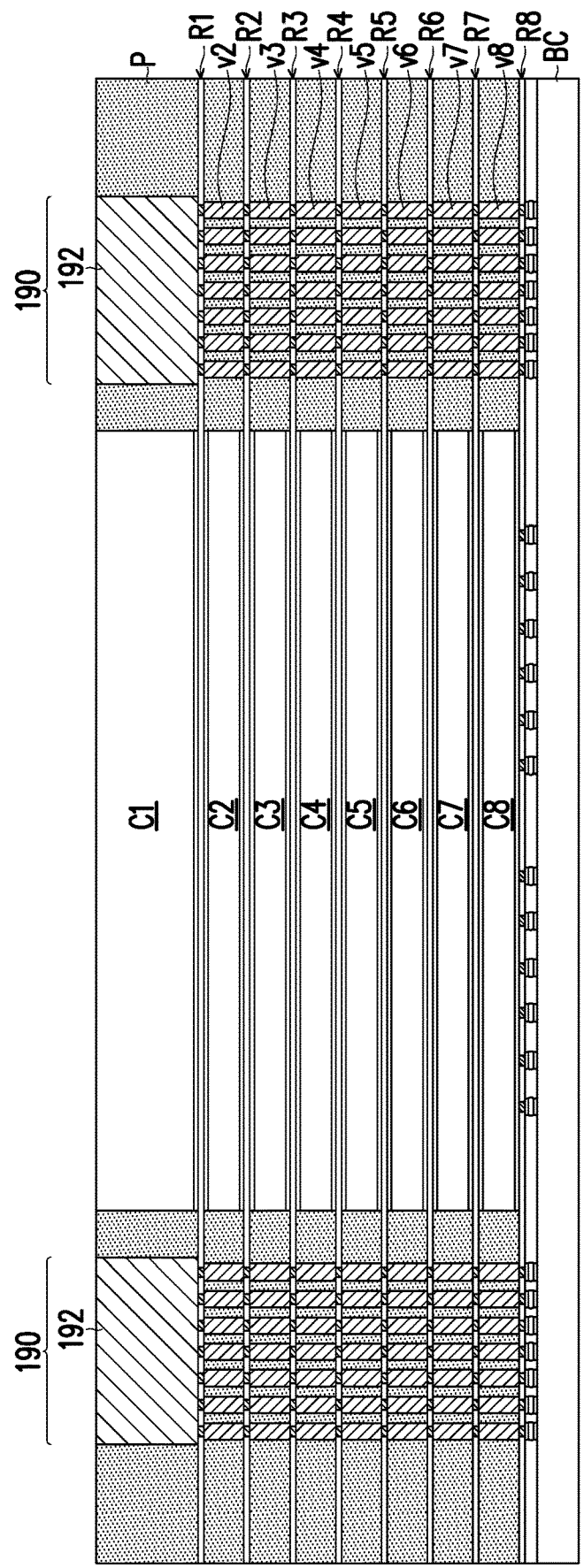

FIG. 18, FIG. 19 and FIG. 20 are schematic top and cross-sectional views showing the exemplary structure of a memory device according to some embodiments of the present disclosure. FIG. 19 and FIG. 20 show the cross-sectional views of the structure along the section lines II-II' and I-I' in FIG. 18.

Referring to FIG. 18 and FIG. 19, in some embodiments, the memory device 19 may be formed with eight tiers T1-T8, and each tier is formed with semiconductor chips C1-C8 and redistribution structures R1-R8. In some embodiments, each of the tiers T2-T8 is formed with TIVs 192A and TCVs v2-v8, and the top tier T1 is formed with thermally conductive walls 192 rather than forming TCVs. The stacked tiers T1-T8 are mounted on and bonded with the base chip BC. In some embodiments, the thermal path structure 190 includes at least the thermally conductive wall 192 and the underlying TCVs v2-v8. From the top view of FIG. 18, it is seen that the two semiconductor chips C1 (as a pair) of the top tier T1 have a rectangular shape and are arranged side-by-side with the long sides in parallel with each other. In FIG. 18, the thermally conductive walls 192 are arranged beside the semiconductor chips C1 with a distance and located at four sides of the pair of the semiconductor chips C1 (i.e. surrounding the semiconductor chips C1). Referring to the top view shown in FIG. 18, in one embodiment, the thermally conductive walls 192 have a rectangular shape and are aligned as a single line beside the pair of the semiconductor chips C1. However, it is understood that the thermally conductive walls 120 may be arranged as multiple lines, columns, rows or even as arrays at one side, two sides, three or four sides of the chips or surrounding the groups of chips, depending on the thermal dissipation requirements. In one embodiment, the thermally conductive walls 192 are of substantially the same size or dimensions, and the thermally conductive walls 192 are separate from one another and spaced apart from the adjacent thermally conductive wall(s) 192 with a uniform spacing. From FIG. 20, it is seen that the thermally conductive walls 192 are connected with the TCVs v2-v8 in a one-to-multiple fashion, and the TCVs v2-v8 in tier T2-T8 are respectively arranged beside the semiconductor chips C2-C8 with a distance and located at four sides of the pair of the semiconductor chips C2-C8.

Figure 21:
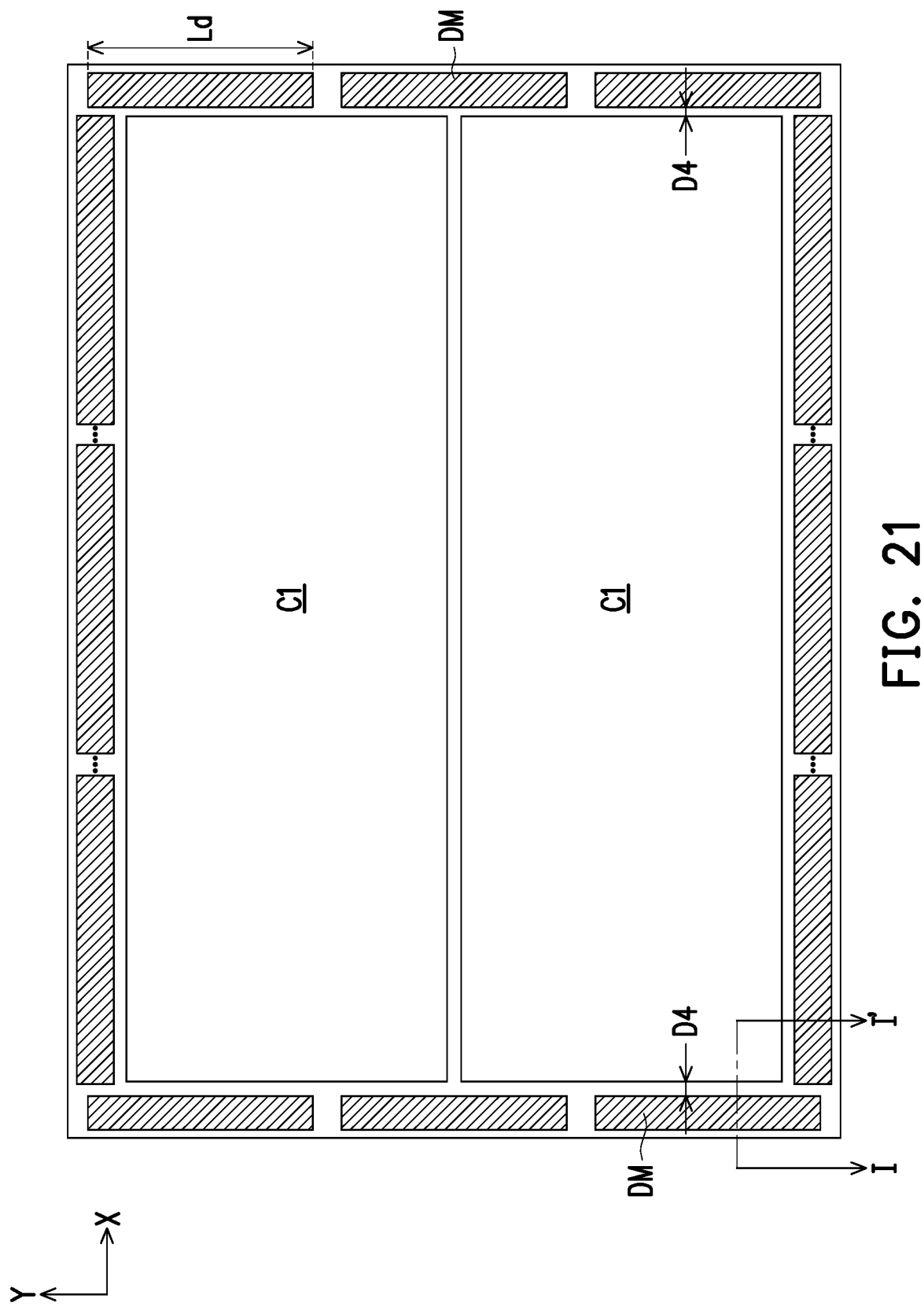
FIG. 21 is a schematic top view of a memory device according to some embodiments of the present disclosure.
Figure 22:
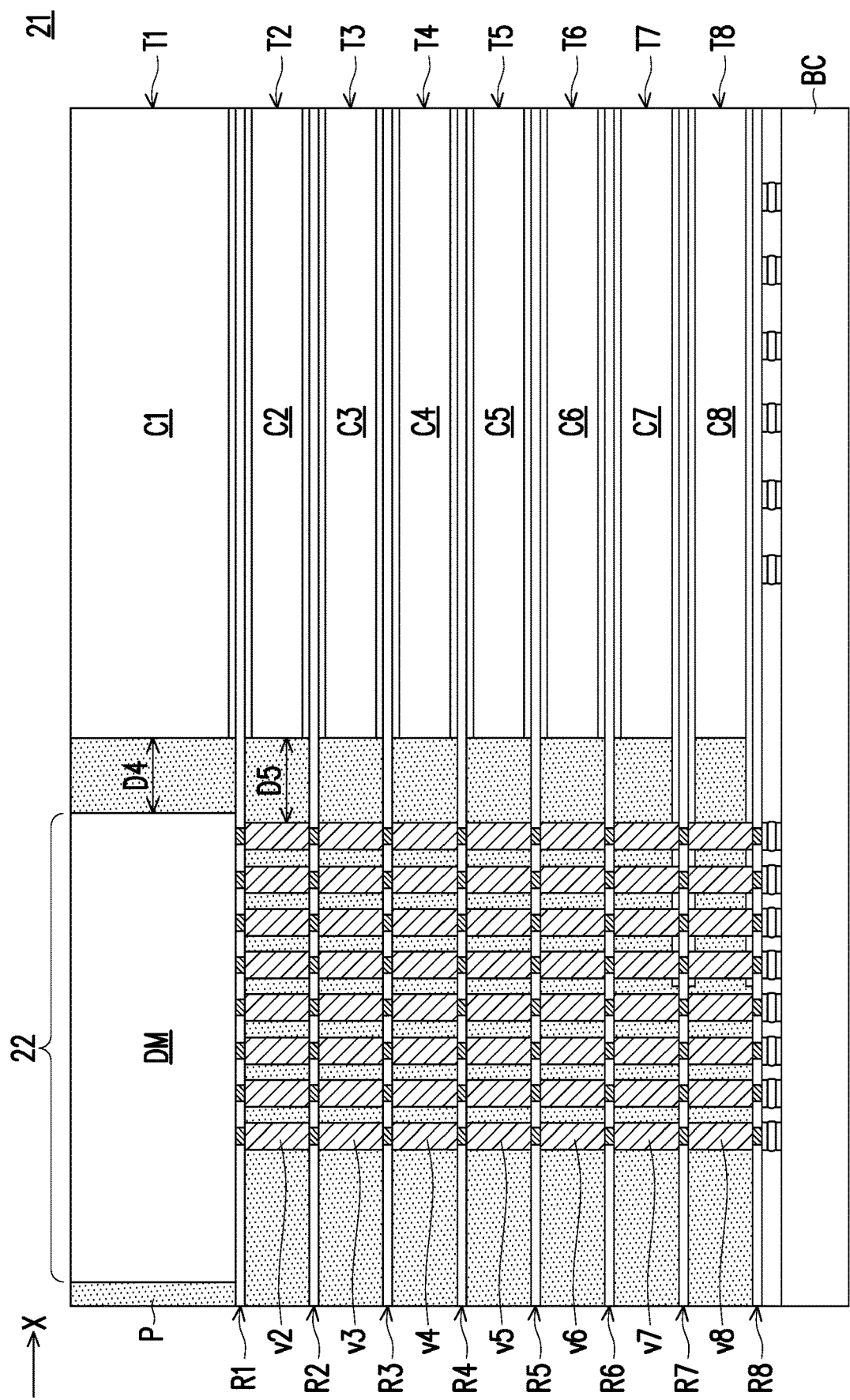
FIG. 22 and FIG. 23 are enlarged schematic cross-sectional views showing a portion of the exemplary structure(s) of a memory device according to embodiments of the present disclosure.
Figure 23:
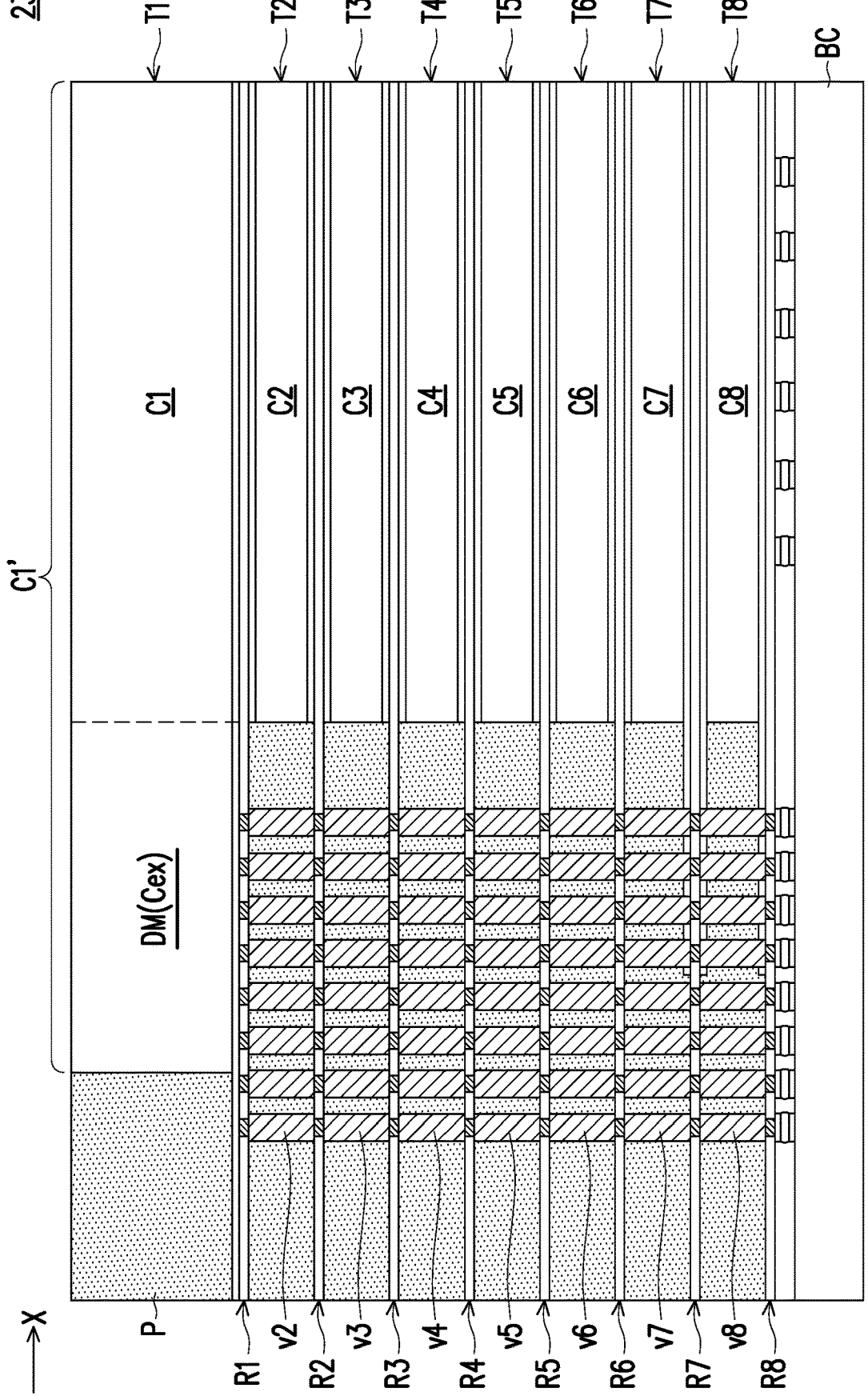

FIG. 21 is a schematic top view of a memory device according to some embodiments of the present disclosure. FIG. 22 and FIG. 23 are enlarged schematic cross-sectional views showing a portion of the memory device according to various embodiments of the present disclosure. FIG. 22 shows the cross-sectional view of the structure along the section line I-I' in FIG. 21.

Referring to FIG. 21 and FIG. 22, the memory device 21 may be formed following the previous described processes, eight tiers T1-T8 are sequentially formed, and each tier is formed with semiconductor chips C1-C8 and redistribution structures R1-R8. In some embodiments, each of the tiers T2-T8 is formed with TIVs (not shown) and TCVs v2-v8 following the previous described processes. However, for the memory device 21, the top tier T1 is provided with dummy dies DM, instead of forming thermally conductive walls or TCVs. That is, during the formation of the top tier T1, dummy dies DM are provided onto the carrier and then laterally wrapped by the encapsulant P but the thermally conductive walls are not formed. The stacked tiers T1-T8 are mounted on and bonded with the base chip BC. In some embodiments, the dummy dies DM are referred to as blocks or bars made of a semiconductor material such as a silicon chip without having active elements or passive elements therein. In some embodiments, the dummy die DM has a thermal conductivity larger than that of the encapsulant P. In some embodiments, the dummy die DM has a thermal conductivity equivalent to or larger than 140 watts per meter-kelvin (W/(m·K)). In some embodiments, the dummy die DM is a silicon chip having a thermal conductivity of about 150 watts per meter-kelvin (W/(m·K)). The dummy die DM may be considered as a thermally conductive block because it provides better thermal conductivity than the encapsulant P. In some embodiments, with the memory device 21, the thermal path structure 22 includes at least the dummy die DM and the underlying TCVs v2-v8. The dummy dies DM and the underlying TCVs v2-v8 vertically stacked with one another form thermal paths for improving heat dissipation. The formation of thermal paths helps to guide the heat generated from the base chip BC through thermal paths to the upper tiers and further to the outer heat sink or cooling module, which significantly improves the heat dissipation of the memory device 21. Through the formation of the thermal path structures, the thermal resistance of the memory device is at least reduced by about 4%, and may be further reduced by about 43%, depending on the hot spot locations of the base chip/die. As a result, the reliability of the memory device 21 is enhanced and the performance of the memory device 21 is boosted.

From the top view of FIG. 21, it is seen that the two semiconductor chips C1 (as a pair) of the top tier T1 have a rectangular shape and are arranged side-by-side with the long sides in parallel with each other. In FIG. 21, the dummy dies DM are arranged beside the semiconductor chips C1 with a distance D4 and located at four sides of the pair of the semiconductor chips C1 (i.e. surrounding the semiconductor chips C1). In some embodiments, the distance D4 (in the X-direction) ranges from about 80 microns to about 110 microns. In some embodiments, the distance D4 (in the X-direction) is about 100 microns. Referring to the top view shown in FIG. 21, in one embodiment, the dummy dies DM have a rectangular shape and are aligned as a single line beside four sides of the pair of the semiconductor chips C1.

However, it is understood that the dummy dies DM may be arranged as multiple lines, columns, rows or even as arrays at one side, two sides, three or four sides of the chips or surrounding the group of chips, depending on the thermal dissipation requirements. In one embodiment, the dummy dies DM are of substantially the same size or dimensions and have a length Ld ranging from about 350 microns to about 400 microns. In one embodiment, the dummy dies DM are of substantially the same length Ld of about 380 microns. In some embodiments, the dummy dies DM have a thickness substantially equivalent to the thickness of the semiconductor chips C1. In some embodiments, the dummy dies DM are separate from one another and spaced apart from the adjacent dummy dies DM with a uniform spacing. From FIG. 22, it is seen that the dummy dies DM are connected with the TCVs v2-v8 in a one-to-multiple fashion, and the TCVs v2-v8 in tier T2-T8 are respectively arranged beside the semiconductor chips C2-C8 with a distance D5 and located at four sides of the pair of the semiconductor chips C2-C8. In some embodiments, the distance D5 (in the X-direction) ranges from about 80 microns to about 110 microns. In some embodiments, vertical projections of the TCVs v2-v8 fall within the span of the vertical projection of the dummy die DM, however the disclosure is not limited thereto. In some embodiments, as seen in FIG. 22, the span of the dummy die DM is larger than the span of the individual TCVs and larger than the total area of the spans of the TCVs in the same tier.

According to some embodiments, in FIG. 23, the memory device 23 has a structure similar to the structure of the memory device 21, except that the dummy dies DM directly contact the semiconductor chips C1 in the top tier T1. In some embodiments, the dummy dies DM are provided as described in the previous embodiments but the locations of the dummy dies DM are right next to the four sides of the pair of semiconductor chips C1. In some alternative embodiments, the provided semiconductor chips C1' are pre-fabricated integrally with the extended portions Cex, and the dummy dies located right next to the chips are replaced by the extended portions Cex at the same locations. The extended portions Cex and the underlying TCVs v2-v8 together form thermal paths for improving heat dissipation. In FIG. 23, some of the TCVs v2-v8 are located outside the span of the dummy die DM or the extended portion Cex. In some embodiments, vertical projections of some of the TCVs v2-v8 fall within the span of the dummy die DM or the extended portion Cex, and vertical projections of some of the TCVs v2-v8 fall outside the span of the dummy die DM or the extended portion Cex. In some embodiments, when the extended portions Cex are integral with and parts of the semiconductor chips C1', it means that the vertical projections of the TCVs v2-v8 may also fall within the spans of the semiconductor chips C1'.

In some embodiments, a memory device may include multiple tiers of vertically stacked semiconductor dies electrically connected through interposed redistribution structures and TIVs. In some embodiments, the memory device further includes additional thermal path structures located at the peripheral regions or edgings of the memory cube(s) or the memory device, and heat generated during operation may be dissipated through the thermal path structures to upper tier(s) or even to external heat sink or cooling module for better heat dissipation efficiency. In some embodiments, the thermal path structures include one or more highly conductive material (e.g., having a thermal conductivity of at least 70 W/(m·K) and are arranged in the area where the heat converges, so that the thermal performance of the memory device can be enhanced, and the reliability and lifetime of the memory device can be increased. Further, the formation of the thermal path structures is compatible with the manufacturing processes for forming the memory device. For example, the thermal path structures may be formed without performing extra process steps as the TCVs may be formed along with the TIVs during the same manufacturing process. Therefore, the reliability and performance of the device or package are improved without significantly raising the production costs.

In accordance with some embodiments of the disclosure, a memory device including a base chip and a memory cube mounted on and connected with the base chip is described. The memory cube includes multiple stacked tiers, and each tier of the multiple stacked tiers includes semiconductor chips laterally wrapped by an encapsulant and a redistribution structure. The semiconductor chips of the multiple stacked tiers are electrically connected with the base chip through the redistribution structures in the multiple stacked tiers. The memory cube includes a thermal path structure extending through the multiple stacked tiers and connected to the base chip. The thermal path structure has a thermal conductivity larger than that of the encapsulant. The thermal path structure is electrically isolated from the semiconductor chips in the multiple stacked tiers and the base chip.

In accordance with some embodiments of the disclosure, a memory device including multiple stacked tiers, a base chip, and a molding compound is described. The base chip is located below and connected with the multiple stacked tiers through connectors there-between. The molding compound laterally wraps the multiple stacked tiers and wraps around the connectors. Each tier of the multiple stacked tiers includes semiconductor chips laterally wrapped by an encapsulant and a redistribution structure. The multiple stacked tiers include through insulator vias (TIVs) electrically connecting the semiconductor chips of the multiple stacked tiers with the base chip through the redistribution structures in the multiple stacked tiers. The multiple stacked tiers include thermal path structures located in a peripheral region at non-facing sides of the semiconductor chips and extending through the multiple stacked tiers. Each of the thermal path structures has a thermal conductivity larger than that of the encapsulant, and the thermal path structures are electrically isolated from the semiconductor chips in the multiple stacked tiers and the base chip.

In accordance with some embodiments of the disclosure, a manufacturing method of a memory device is provided. The method includes at least the following steps. First semiconductor chips are disposed side by side, and thermally conductive blocks are provided at non-facing sides of the first semiconductor chips. The first semiconductor chips and the thermally conductive blocks are laterally wrapped in a first encapsulant. A first redistribution structure is formed on the first semiconductor chips, the thermally conductive blocks and the first encapsulant. Thermally conductive vias (TCVs) and through insulator vias (TIVs) are formed on the first redistribution structure. The TCVs are formed at locations right above the thermally conductive blocks and beside the first semiconductor chips, and the TIVs are formed at locations right above the first semiconductor chips. Second semiconductor chips are disposed on the first redistribution structure beside the TIVs, between the TIVs and the TCVs and between TCVs. The second semiconductor chips, the TCVs and the TIVs are laterally wrapped in a second encapsulant. A second redistribution structure is formed on the second semiconductor chips, the TCVs, the TIVs and the second encapsulant. Connectors are formed over the second redistribution structure. A base chip is electrically connected with the first and second semiconductor chips through the connectors, the TIVs and the first and second redistribution structures.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
a base chip; and
a memory cube, mounted on and connected with the base chip,
wherein the memory cube includes multiple stacked tiers, each tier of the multiple stacked tiers includes semiconductor chips laterally wrapped by an encapsulant and a redistribution structure, the multiple stacked tiers include a top tier, a middle tier underlying the top tier, and a bottom tier located below the middle tier, and the semiconductor chips of the multiple stacked tiers are electrically connected with the base chip through the redistribution structures in the multiple stacked tiers, and
wherein the memory cube includes a thermal path structure extending through the multiple stacked tiers and connected to the base chip, the thermal path structure has a thermal conductivity larger than that of the encapsulant, the thermal path structure includes thermally conductive vias (TCVs) located in the middle tier and located in the bottom tier, the TCVs penetrating through the encapsulant of the middle tier are in direct contact with the encapsulant of the middle tier, the TCVs penetrating through the encapsulant of the bottom tier are in direct contact with the encapsulant of the bottom tier, and the thermal path structure is laterally wrapped by the encapsulants and electrically isolated from the semiconductor chips in the multiple stacked tiers and the base chip.

2. The memory device of claim 1, wherein the thermal path structure includes a thermally conductive wall located in the top tier.

3. The memory device of claim 2, wherein a material of the thermally conductive wall is substantially the same as a material of the TCVs.

4. The memory device of claim 2, wherein a material of the thermally conductive wall is different from a material of the TCVs.

5. The memory device of claim 1, wherein the thermal path structure includes a dummy die located in the top tier and thermally conductive vias (TCVs) located on the middle tier and the bottom tier.

6. The memory device of claim 5, wherein the dummy die is made of a semiconductor material, and the semiconductor material of the dummy die is different from a material of the TCVs.

7. The memory device of claim 2, wherein the semiconductor chips in the middle tier are vertically stacked with the semiconductor chips in the bottom tier.

8. The memory device of claim 7, wherein the semiconductor chips in the top tier are spaced apart with a first distance, the semiconductor chips in the middle tier are spaced apart with a second distance, the semiconductor chips in the bottom tier are spaced apart with a third distance, the first distance is smaller than the second distance and the third distance.

9. A memory device, comprising:
multiple stacked tiers, wherein the multiple stacked tiers include a top tier, a middle tier underlying the top tier, and a bottom tier located below the middle tier;
a base chip, located below and connected with the multiple stacked tiers through connectors there-between; and
a molding compound, laterally wrapping the multiple stacked tiers and wrapping around the connectors,
wherein each tier of the multiple stacked tiers includes semiconductor chips laterally wrapped by an encapsulant and a redistribution structure, the multiple stacked tiers include through insulator vias (TIVs) electrically connecting the semiconductor chips of the multiple stacked tiers with the base chip through the redistribution structures in the multiple stacked tiers, and
wherein the multiple stacked tiers include thermal path structures located in a peripheral region at non-facing sides of the semiconductor chips and extending through the multiple stacked tiers, each of the thermal path structures include thermally conductive vias (TCVs) located in the middle tier and located in the bottom tier, the TCVs penetrating through the encapsulant of the middle tier are in direct contact with the encapsulant of the middle tier, the TCVs penetrating through the encapsulant of the bottom tier are in direct contact with the encapsulant of the bottom tier, and the thermal path structures are laterally wrapped by the encapsulants and electrically isolated from the semiconductor chips in the multiple stacked tiers and the base chip.

10. The memory device of claim 9, wherein each of the thermal path structures includes a thermally conductive wall located in the top tier.

11. The memory device of claim 10, wherein a material of the thermally conductive wall includes silver paste, and a material of the TCVs includes copper or copper alloys.

12. The memory device of claim 10, wherein a material of the thermally conductive wall is substantially the same as a material of the TCVs and includes copper or copper alloys.

13. The memory device of claim 9, wherein the base chip is a semiconductor chip and the molding compound does not cover sidewalls of the base chip.

14. The memory device of claim 13, wherein the base chip includes a logic chip.

15. The memory device of claim 9, wherein each of the thermal path structures includes a semiconductor material dummy die located in the top tier.

16. The memory device of claim 15, wherein a material of the semiconductor material dummy die includes silicon, and a material of the TCVs includes copper or copper alloys.

* * * * *